United States Patent
Liang et al.

(10) Patent No.: US 10,425,732 B1
(45) Date of Patent: Sep. 24, 2019

(54) SOUND PRODUCING DEVICE

(71) Applicant: xMEMS Labs, Inc., Saratoga, CA (US)

(72) Inventors: Jemm Yue Liang, Sunnyvale, CA (US); Chiung C. Lo, San Jose, CA (US)

(73) Assignee: xMEMS Labs, Inc., Los Altos, CA (US)

( * ) Notice: Subject to any disclaimer, the term of this patent is extended or adjusted under 35 U.S.C. 154(b) by 0 days.

(21) Appl. No.: 16/125,761

(22) Filed: Sep. 9, 2018

Related U.S. Application Data

(60) Provisional application No. 62/652,908, filed on Apr. 5, 2018, provisional application No. 62/660,182, filed on Apr. 19, 2018, provisional application No. 62/719,355, filed on Aug. 17, 2018.

(51) Int. Cl.
   *H04R 3/04* (2006.01)
   *H04R 1/02* (2006.01)
   *H04R 17/00* (2006.01)
   *H04R 19/00* (2006.01)

(52) U.S. Cl.
   CPC .............. *H04R 3/04* (2013.01); *H04R 1/025* (2013.01); *H04R 17/00* (2013.01); *B81B 2201/0257* (2013.01); *B81B 2207/015* (2013.01); *B81B 2207/017* (2013.01); *H04R 19/005* (2013.01);
   (Continued)

(58) Field of Classification Search
   CPC .......... H04R 3/04; H04R 19/02; H04R 1/403; H04R 17/00; H04R 1/025; H04R 2499/11; H04R 19/005; H04R 31/00; B81B 7/0061; B81B 7/0074; B81B 2201/0257; B81B 7/007; B81C 1/00238; B81C 1/00301; B81C 2203/0792; B01D 69/10;
   (Continued)

(56) References Cited

U.S. PATENT DOCUMENTS

| | | | | |
|---|---|---|---|---|
| 3,846,792 A | * | 11/1974 | Haigh | B06B 1/0284 340/384.73 |
| 5,146,434 A | * | 9/1992 | Bromley | G10K 11/002 116/137 R |

(Continued)

FOREIGN PATENT DOCUMENTS

| | | | | |
|---|---|---|---|---|
| WO | 2016/202790 A2 | 12/2016 | | |
| WO | WO-2016202790 A2 | * 12/2016 | ......... | B81C 1/00158 |

OTHER PUBLICATIONS

Jemm Yue Liang et al., Title: Air Pulse Generating Element and Manufacturing Method Thereof, pending U.S. Appl. No. 16/161,067, filed Oct. 16, 2018.

(Continued)

*Primary Examiner* — Oyesola C Ojo
(74) *Attorney, Agent, or Firm* — Winston Hsu

(57) ABSTRACT

The present invention provides a sound producing device comprising: an air pulse generating element and a control unit. The air pulse generating element comprises an air chamber and an actuator. The control unit, configured to generate a driving voltage applied to the actuator of the air pulse generating element, such that the air pulse generating element generates a plurality of air pulses in response to the driving voltage. The plurality of air pulses are at a pulse rate, and the pulse rate of the plurality of air pulses is higher than a maximum audible frequency.

30 Claims, 24 Drawing Sheets

(52) U.S. Cl.
CPC .... *H04R 2201/003* (2013.01); *H04R 2499/11* (2013.01)

(58) Field of Classification Search
CPC ........ G10K 11/002; G10K 11/26; G10K 5/02; H04W 4/14
See application file for complete search history.

(56) References Cited

U.S. PATENT DOCUMENTS

| | | | | |
|---|---|---|---|---|
| 6,163,613 | A * | 12/2000 | Cowans | H04R 3/007 381/111 |
| 7,747,029 | B2 * | 6/2010 | Kim | H04R 23/00 381/152 |
| 8,861,752 | B2 * | 10/2014 | Margalit | H04R 1/22 381/152 |
| 9,637,374 | B2 * | 5/2017 | Jenkins | B81B 3/0021 |
| 9,843,862 | B2 * | 12/2017 | Barzen | H04R 3/06 |
| 2002/0076139 | A1 * | 6/2002 | Kobrin | B81B 3/0027 385/18 |
| 2003/0215972 | A1 * | 11/2003 | Zou | B81C 1/00214 438/48 |
| 2007/0237338 | A1 * | 10/2007 | Konchitsky | H04M 1/035 381/91 |
| 2009/0124035 | A1 * | 5/2009 | Rey | B81C 1/00158 438/52 |
| 2011/0140216 | A1 * | 6/2011 | Qu | B81C 1/00952 257/419 |
| 2012/0018244 | A1 * | 1/2012 | Robert | B06B 1/0292 181/142 |
| 2012/0308046 | A1 * | 12/2012 | Muza | H04R 19/02 381/111 |
| 2013/0044904 | A1 * | 2/2013 | Margalit | H04R 1/22 381/182 |
| 2016/0381464 | A1 * | 12/2016 | Elyada | H04R 19/02 381/97 |
| 2017/0201192 | A1 | 7/2017 | Tumpold | |
| 2017/0280218 | A1 * | 9/2017 | Wang | H04R 19/016 |
| 2018/0206042 | A1 * | 7/2018 | Kursula | H04R 19/04 |

OTHER PUBLICATIONS

John J. Neumann Jr. et al., CMOS-MEMS membrane for audio-frequency acoustic actuation, Sensors and Actuators A 95, 2002, pp. 175-182, Elsevier, USA, XP004377889.

* cited by examiner

SOUND PRODUCING DEVICE

CROSS REFERENCE TO RELATED APPLICATIONS

This application claims the benefit of U.S. provisional application No. 62/652,908, filed on Apr. 5, 2018, U.S. provisional application No. 62/660,182, filed on Apr. 19, 2018 and U.S. provisional application No. 62/719,355, filed on Aug. 17, 2018, which are all incorporated herein by reference.

BACKGROUND OF THE INVENTION

1. Field of the Invention

The present invention relates to a sound producing device, and more particularly, to a sound producing device capable of producing high fidelity sound with small size.

2. Description of the Prior Art

Speaker driver is always the most difficult challenge for high-fidelity sound reproduction in the speaker industry. The physics of sound wave propagation teaches that, within the human audible frequency range, the sound pressures generated by accelerating a membrane of a conventional speaker drive may be expressed as $P \propto S \cdot A$ (eq-1), where S is the membrane surface area and A is the acceleration of the membrane. Namely, the sound pressure P is proportional to the product of the membrane surface area S and the acceleration of the membrane A. In addition, the membrane displacement D may be expressed as $D \propto \frac{1}{2} \cdot A \cdot T^2 \propto 1/f^2$ (eq-2), where T and f are the period and the frequency of the sound wave respectively. The air volume movement $V_{A,CV}$ caused by the conventional speaker driver may then be expressed as $V_{A,CV} \propto S \cdot D$. For a specific speaker driver, where the membrane surface area is constant, the air movement $V_{A,CV}$ is proportional to $1/f^2$, i.e., $V_{A,CV} \propto 1/f^2$ (eq-3).

For example, in a conventional electrodynamics speaker driver, where its coils and magnets are used to produce membrane driving force, the sound of 18 KHz is produced by its membrane with a certain surface area vibrating at 18 KHz, while the sound of 30 Hz is also produced by the membrane vibrating at 30 Hz. As a result, the ratio of net air volumes moved by the membrane between these two frequencies (i.e., 30 Hz and 18 KHz) will be 360,000. In other words, in order to produce the same sound pressure level (SPL) at 30 Hz, the speaker driver will need to move 360,000 times the amount of air required for producing the same sound pressure level at 18 KHz.

To cover a full range of human audible frequency, e.g., from 20 Hz to 20 KHz, tweeter(s), mid-range driver(s) and woofer(s) have to be incorporated within a conventional speaker. All these additional components would occupy large space of the conventional speaker and will also raise its production cost. Hence, one of the design challenges for the conventional speaker is the impossibility to use a single driver to cover the full range of human audible frequency.

Another design challenge for producing high-fidelity sound by the conventional speaker is its enclosure. The speaker enclosure is often used to contain the back-radiating wave of the produced sound to avoid cancelation of the front radiating wave in certain frequencies where the corresponding wavelengths of the sound are significantly larger than the speaker dimensions. The speaker enclosure can also be used to help improve, or reshape, the low-frequency response, for example, in a bass-reflex (ported box) type enclosure where the resulting port resonance is used to invert the phase of back-radiating wave and achieves an in-phase adding effect with the front-radiating wave around the port-chamber resonance frequency. On the other hand, in an acoustic suspension (closed box) type enclosure where the enclosure functions as a spring which forms a resonance circuit with the vibrating membrane. With properly selected speaker driver and enclosure parameters, the combined enclosure-driver resonance peaking can be leveraged to boost the output of sound around the resonance frequency and therefore improves the performance of resulting speaker.

One of the key factors in determining the low frequency fidelity of a conventional speaker, with either type of enclosures, is the volume of the speaker enclosure, or equivalently, the ratio of $V_A/V_{EN}$, where $V_A$ denotes a general air volume movement calculated according to Eq-2 and $V_{EN}$ denotes the volume of the enclosure. When the speaker enclosure's internal volume is not sufficiently large, this ratio rises and the pressure fluctuation inside the enclosure also rises, which causes nonlinearity or distortion of membrane movement near the min-max peaks of its movement range. To avoid the nonlinearity of the membrane movement, the conventional speaker enclosures are expected to contain sufficiently large volumes. For most high-fidelity speakers, the internal enclosure volumes are therefore generally vastly larger than the physical volumes of their speaker drivers.

Recently, micro-speakers are expected to be contained within devices such as smartphones, tablets notebooks or even earphones. In any of such compact devices, the volume of speaker enclosure is usually made extremely small due to the size constraint of its host devices. Such small enclosures will cause "enclosure compression induced distortion" which leads to sharply rising distortion as sound frequency goes lower and results in drastically degraded low frequency sound quality/fidelity.

Therefore, how to design a small sound producing device while overcoming the design challenges faced by conventional speakers as stated above is an important objective in the field.

SUMMARY OF THE INVENTION

It is therefore a primary objective of the present invention to provide a sound producing device capable of producing high fidelity sound with small size.

An embodiment of the present invention provides a sound producing device comprising: an air pulse generating element and a control unit. The air pulse generating element comprises an air chamber and an actuator. The control unit, configured to generate a driving voltage applied to the actuator of the air pulse generating element, such that the air pulse generating element generates a plurality of air pulses in response to the driving voltage. The plurality of air pulses are at a pulse rate, and the pulse rate of the plurality of air pulses is higher than a maximum audible frequency.

In an embodiment, an air mass velocity, produced by an air pulse among the plurality of plurality of air pulses, is initiated from an initial value, increases and achieves a peak value, and decreases down to a final value within a pulse cycle of the air pulse.

In an embodiment, an air pulse, among the plurality of plurality of air pulses, within a pulse cycle is a positive pulse, a negative pulse or a null pulse, and air mass velocities corresponding to the positive pulse and the negative pulse are in opposite directions In an embodiment, the sound producing device receives an input audio signal, and an amplitude and a polarity of each air pulse generated by the sound producing device are related to an amplitude and a polarity of a time-sample of the input audio signal.

In an embodiment, the sound producing device comprises a plurality of air pulse generating element, the control unit generates a plurality of driving voltages to the plurality of air pulse generating element, such that the plurality of air pulse generating elements produces a plurality of sound pressure levels. The plurality of air pulse generating elements is grouped into a plurality of air pulse generating groups, each air pulse generating group comprises one or more air pulse generating element, and the control unit generates the plurality of driving voltages corresponding to the plurality of air pulse generating groups. The plurality of driving voltages have the same min-max amplitudes but different voltage profiles.

In an embodiment, the air pulse element further comprises a membrane and a plurality of valves. The sound producing device forms an air chamber and the membrane partitions the air chamber into a plurality of sub-chambers. The plurality of valves is controlled by the control unit to be opened and closed, so as to control a direction of an air flow corresponding to an air pulse within one sub-chamber of the plurality of sub-chamber.

In an embodiment, a modified sigma-delta scheme, using a feedback loop structure, is used to continuously updating a residual error while generating the plurality of pulses, where the residual error calculation is based on actual audible sound pressure produced by the plurality of pulses.

In an embodiment, the sound producing device is applied in a speaker. The speaker comprises a back enclosure. The back enclosure contains an internal volume to buffer the plurality of air pulses. The back enclosure comprises an absorption object configured to dissipate pulsing energy of the plurality of air pulses In an embodiment, the sound producing device may be applied in an active thermal management or active cooling applications.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
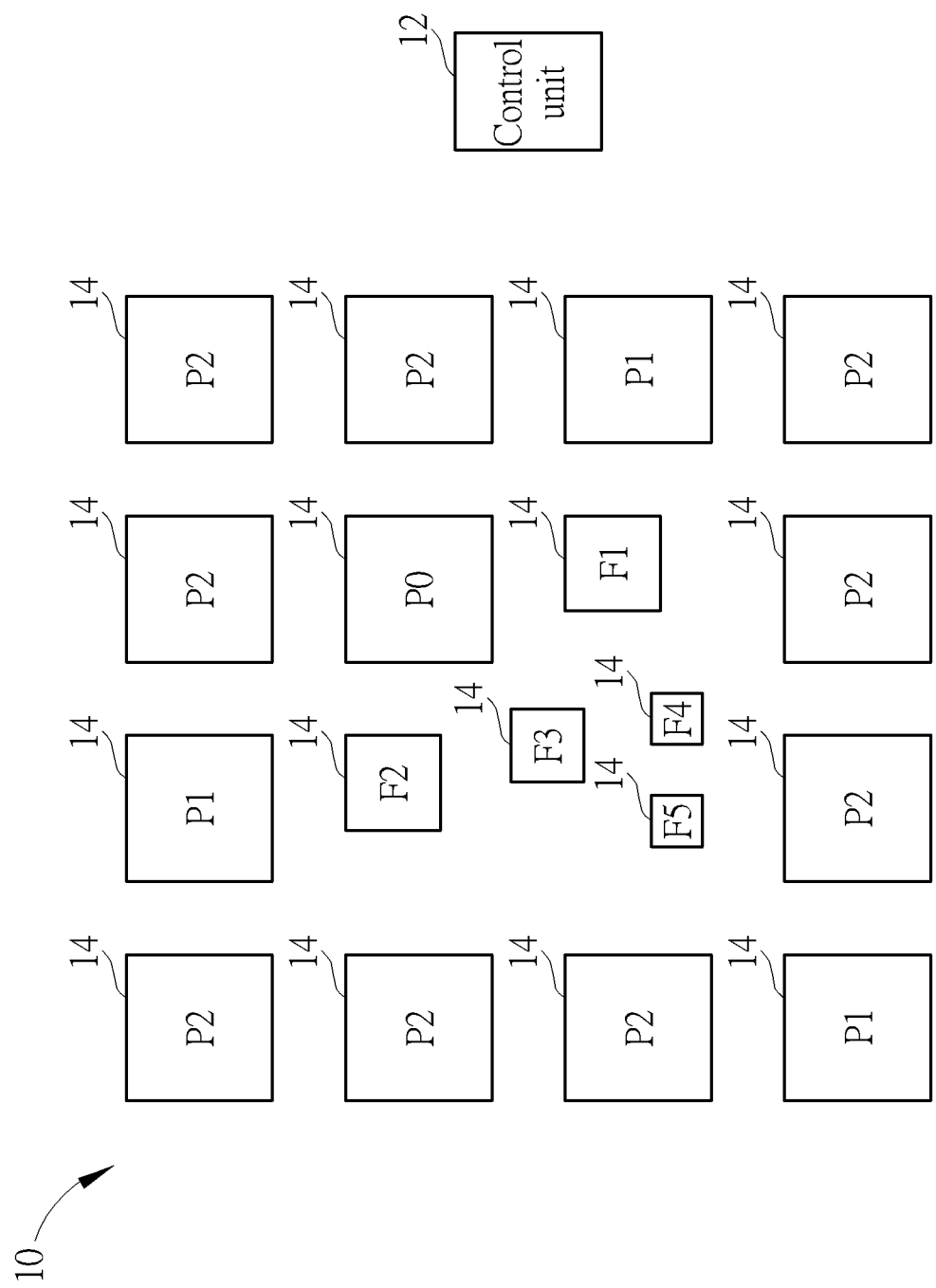
FIG. 1 is a schematic diagram of a sound producing device according to an embodiment of the present invention.

Referring to FIG. 1, which is a schematic diagram of a sound producing device 10 according to an embodiment of the present invention. Instead of producing a sound at the frequency of sound, i.e., generating a sound wave complying with the zero-mean-flow assumption of classic acoustic wave theorems, as the conventional sound producing devices would have done, the sound producing device 10 generates a series of air pulses at a pulse rate, as shown in FIGS. 6-9 and 11-12, where the pulse rate is significantly higher than the maximum human audible frequency. The air pulses represent a variation in air/sound pressure caused by the sound producing device 10 within a pulse cycle, where the pulse cycle is an inverse/reciprocal of the pulse rate. In other words, the plurality of air pulses is in terms of a sound pressure level (SPL) or an air mass velocity. In an embodiment, the pulse rate may be an ultrasonic rate, e.g., 64 KHz, significantly higher than twice of the maximum human audible frequency, which is generally considered to be 20K Hz. This pulse rate is determined based on Nyquist law, which states, in order to avoid frequency spectral aliasing, the pulse rate needs to be at least twice higher than the maximum frequency of the input audio signal. The series/plurality of air pulses generated by the sound producing device 10 may be referred as an ultrasonic pulse array (UPA).

The sound producing device 10 comprises air pulse generating elements 14 and a control unit 12. Each air pulse generating element 14 comprises valves, an air chamber and an actuator, which will be discussed later. The control unit 12 is coupled to all of the air pulse generating elements 14 to control their air pulse generating operations. Specifically, the control unit 12 generates valve-controlling signals to the valves of the air pulse generating elements 14 and driving voltages $V_{MBN}$ to the actuators of the air pulse generating elements 14, such that the air pulse generating elements 14 generates the plurality of air pulses, i.e., UPA, in response to the driving voltages $V_{MBN}$.

In the embodiment illustrated in FIG. 1, the air pulse generating elements 14 are grouped into air pulse generating groups labeled as P0, P1, P2, and F1-F5. The air pulse generating group P2 includes 9 air pulse generating elements 14, the air pulse generating group P1 includes 3 air pulse generating elements 14, and the air pulse generating groups P0 and F1-F5 includes 1 air pulse generating element 14, respectively. The way of grouping the air pulse generating elements shown in FIG. 1 serves as an embodiment for illustrative purpose only, which is not limited thereto. For example, the illustrated grouping is in a base-3 arrangement, which does not preclude using a base-2 arrangement. Note that, the base-2 arrangement would require more control electrodes to achieve the same level of THD (total harmonic distortion). Specifically, the base-2 arrangement would require $\ln(3^N)/\ln(2)/N=1.585$ times the number of control electrodes compared to the base-3 arrangement.

Figure 2:
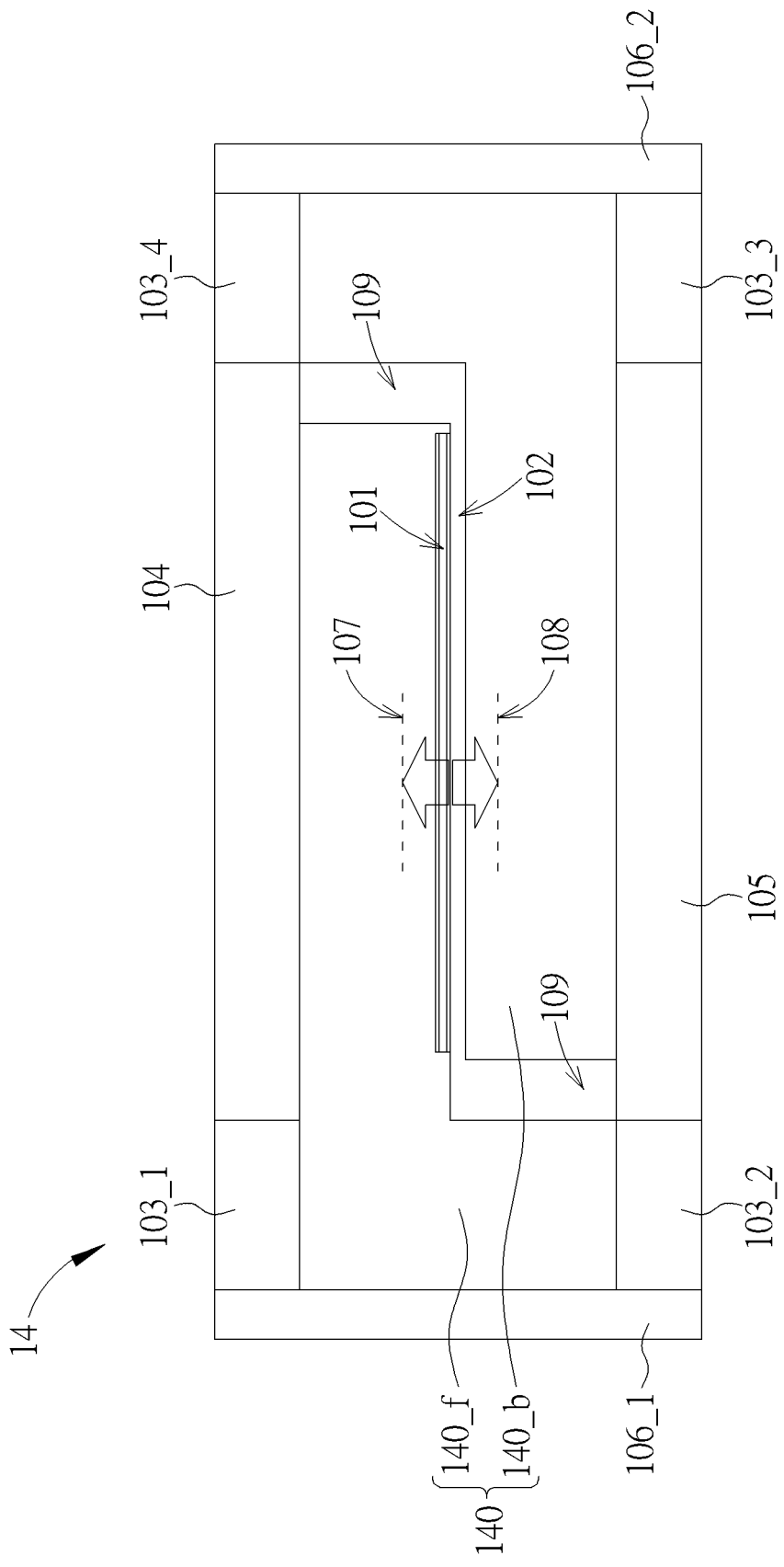
FIG. 2 is a schematic diagram of a cross sectional view of an air pulse generating element according to an embodiment of the present invention.
Figure 3:
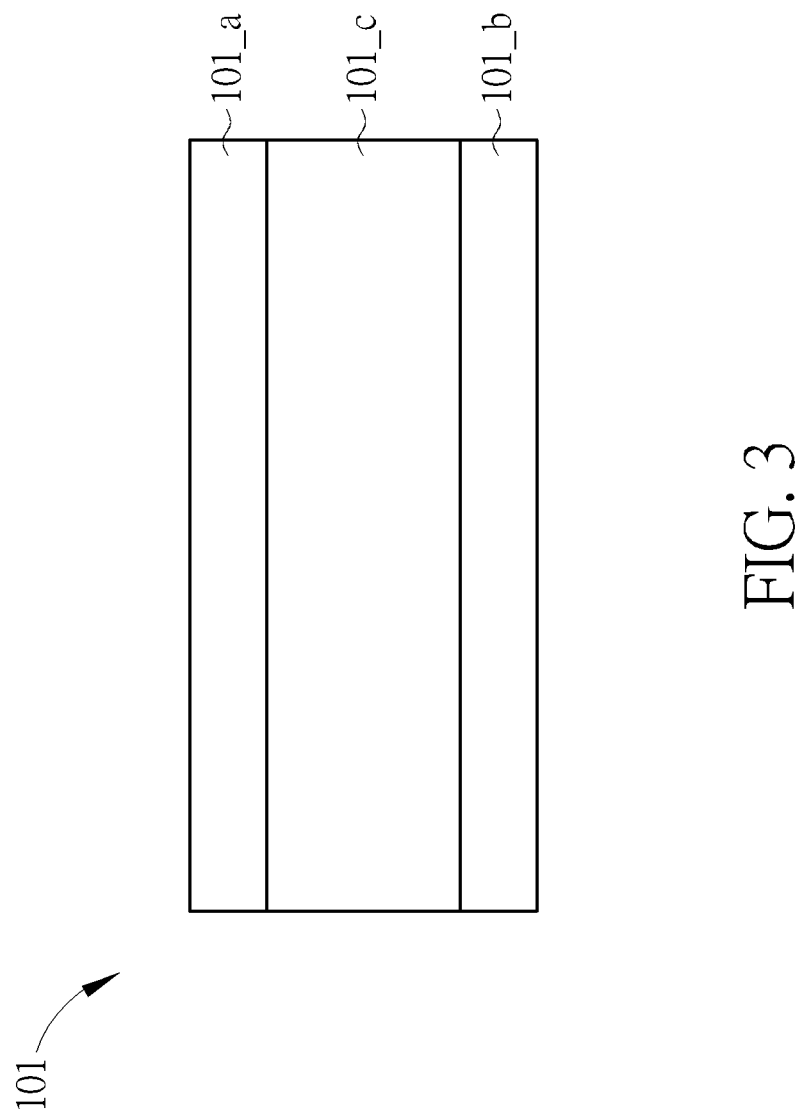
FIG. 3 is a schematic diagram of an actuator according to an embodiment of the present invention.

An embodiment of the structure of the air pulse generating element 14 and an actuator is illustrated in FIG. 2 and FIG. 3. Specifically, FIG. 2 and FIG. 3 are schematic diagrams of a cross-sectional view of the air pulse generating element 14 and an actuator 101 according to an embodiment of the present invention, respectively. The air pulse generating element 14 may be a MEMS (micro-electrical-mechanical-system) device. In the structure illustrated in FIG. 2, the air pulse generating element 14 comprises an actuator layer 101, a membrane layer 102, valves 103_1-103_4, a front faceplate 104, a back faceplate 105, side walls 106_1 and 106_2 and membrane supporting elements 109. The front faceplate 104, the back faceplate 105 and the side walls 106_1, 106_2 forms an air chamber 140. Again, the structure of the air pulse generating element 14 shown in FIG. 2 serves as an embodiment for illustrative purpose, which is not limited thereto.

The membrane 102 is a thin membrane made of Silicon (Si), preferably single crystal Si. The actuator 101, disposed on the membrane 102, may comprise a piezoelectric layer 101_c sandwiched between two electrodes 101_a and 101_b. The driving voltage $V_{MBN}$ is applied on the top electrode 101_a and the bottom electrode 101_b. The piezoelectric layer 101_c may, but not limited to, be made of PZT (lead zirconate titanate) or AlScN (scandium doped aluminum nitride). PZT, and epi-PZT in particular, is one of preferred piezoelectric materials due to its high $\varepsilon_{31}$. On the other hand, AlScN possesses symmetrical bipolar driving characteristics which can greatly simplify the geometric design of the sound producing device 10.

In the current embodiment, the actuator 101 and the membrane 10 produce the plurality of air pulses through piezoelectric force. In another embodiment, the air pulse generating element 14 may also comprise another type of actuating means disposed on the membrane 102. In an embodiment, the face plates 104 and 105 may be made of magnetic material and form a static magnetic field, and the actuator means 101 may comprise of a planar coil. When the driving voltage is applied to planar coil actuator 101, a corresponding electromagnetic field is generated, resulting in a magnetic force which causes the membrane 102 to move between the position 107 and the position 108. The actuation of valves 103_1-103_4 can likewise employ the force generated through the interaction between static magnetic field and dynamic electromagnetic field as the case of the membrane described above, which is also within the scope of the present invention.

In an embodiment, the face plates 104 and 105 may be made of electric conducting materials. A suitable voltage may be applied across the face plates 104 and 105. A static electric field is then formed, where + (positive) resides on the bottom surface of the face plate 104 and − (negative) resides on the top surface of the faceplate 105. The actuator means 101 may comprise an electric conducting plate. When the driving voltage is applied to the plate actuator 101, two actuating electric fields are generated between the actuator 101 and the plate 104 and between the actuator 101 and the plate 105, resulting in a net electric force which causes the membrane 102 moving between the position 107 and the position 108. The actuation of valves 103_1-103_4 can likewise employ the force generated through the interaction between static electric field and actuating electric field as the case of the membrane described above, which is also within the scope of the present invention.

In another perspective, the front faceplate 104 is disposed at a front side of the air pulse generating element 14; while the back faceplate 105 is disposed at a back side of the air pulse generating element 14. The valve 103_1 is disposed by a first edge of the front faceplate 104 and controlled by a valve-controlling signal G; the valve 103_2 is disposed by a first edge of the back faceplate 105 and controlled by a valve-controlling signal H; the valve 103_3 is disposed by a second edge of the back faceplate 105 and controlled by a valve-controlling signal G; the valve 103_4 is disposed by a second edge of the front faceplate 104 and controlled by a valve-controlling signal H. Thus, the valves 103_1 and 103_2, the front faceplate 104, the supporting elements 109, the membrane 102 and the side wall 106_1 form a front sub-chamber 140_f; while the valves 103_3 and 103_4, the back faceplate 105, the supporting elements 109, the membrane 102 and the side wall 106_2 form a back sub-chamber 140_b. The front sub-chamber 140_f and the back sub-chamber 140_b together form the air chamber 140.

The actuator 101 is disposed on the membrane 102. The driving voltage $V_{MBN}$ is applied to the actuator 101 and the actuator 101 is deformed to cause the membrane 102 to have an up-and-down movement, where the driving voltage $V_{MBN}$ is generated by the control unit 12. In addition, the valves 103_1, 103_3 and the valves 103_2, 103_4 are controlled to be opened and closed alternatively, performing an open-and-close movement. By properly design the timing of the driving voltage $V_{MBN}$ and the valve-controlling signals G and H, the air pulse generating element 14 is able to generate a plurality of air pulses.

Figure 4:
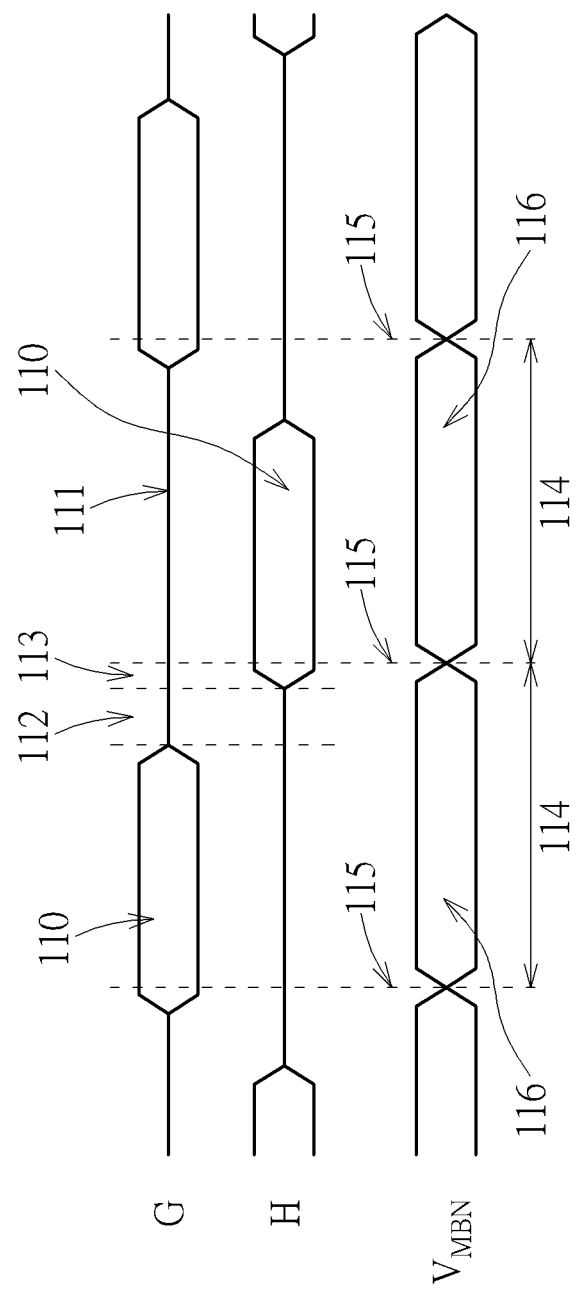
FIG. 4 is a timing diagram of a driving voltage and valve-controlling signals according to an embodiment of the present invention.

Referring to FIG. 4, which is a timing diagram of the driving voltage $V_{MBN}$ and the valve-controlling signals G and H according to an embodiment of the present invention. In FIG. 4, the hexagon 110 within the valve-controlling signal G/H represents that the corresponding valve(s) is opened, the straight line 111 within the valve-controlling signal G/H represents that the corresponding valve(s) is closed, and the hexagon 116 represents a time period of the membrane 102 performing the up-and-down movement, either moving from the down position 108 to the up position 107 or moving from the up position 107 to the down position 108 within one pulse cycle. Within each pulse cycle 114, an air pulse is generated by applying the driving voltage $V_{MBN}$ to the actuator 101 to perform the up-and-down movement.

As can be seen from FIG. 4, the up-and-down movement performed by the membrane 102 within the pulse cycle 114 (referred to the hexagon 116) and the open-and-close movement performed by the valves 103_1-103_4 (referred to the alternation between the hexagon 110 and the straight lines 112, 113 and 111) are mutually synchronized.

In addition, the time 112 serves the transition time from the valves 103_1, 103_3 opened to the valves 103_2, 103_4 opened. During the time 112, all the valves 103_1-103_4 are closed.

Four operation modes of the air pulse generating element 14 are tabulated in Table I. The "Up=>Down" in the leftmost column of Table I represents that the membrane 102 is driven to move from the up position 107 (illustrated in FIG. 2) to the down position 108 (illustrated in FIG. 2), and the "Down=>Up" represents that the membrane 102 is driven to move from the down position 108 to the up position 107. The "G=1, H=0" in the $2^{nd}$ row of Table I represents that the valves 103_1, 103_3 are opened and the valves 103_2, 103_4 are closed. The "G=0, H=1" in Table I represents that the valves 103_1, 103_3 are closed and the valves 103_2, 103_4 are opened.

TABLE I

| Up-and-Down Movement of Membrane | Status of Valves | |
| --- | --- | --- |
| | G = 1, H = 0 | G = 0, H = 1 |
| Up => Down | Front-to-Back | Back-to-Front |
| Down => Up | Back-to-Front | Front-to-Back |

Take the first pulse cycle 114 in FIG. 4 representing "G=1, H=0" as an example, if the membrane 102 is controlled to be move from the up position 107 to the down position 108, the air is "pulled" into the front chamber and "pushed" out of the back chamber, and the air-flow is in a front-to-back direction, meaning that the air pulse generating element 14 generates a negative air pulse (denoted as a "−1" state). If the membrane 102 is controlled to be move from the down position 108 to the up position 107, the air is "pushed" out of the front chamber and "pulled" into the back chamber, and the air-flow is in a back-to-front direction, meaning that the air pulse generating element 14 generates a positive air pulse (denoted as a "+1" state). Operation within the second pulse cycle 114 in FIG. 4 representing "G=0, H=1" is likewise performed in a similar way yet opposite direction to the first pulse cycle 114 representing "G=1, H=0", which is not narrated herein for brevity.

In addition, the polarity/direction of the air pulse generated within the current pulse cycle 114 may be independent of an initial position of the membrane 102, meaning that the polarity/direction of the air pulse generated within the current pulse cycle 114 may be independent of polarity/direction of the air pulse within the previous pulse cycle 114. For example, if an initial position of the membrane 102 within the current pulse cycle 114 is at the up position 107 and the membrane 102 is driven to the down position 108 at the end of the current pulse cycle 114, the air pulse generating element 14 may generate a negative pulse by controlling the valves 103_1-103_4 in the "G=1, H=0" status, or the air pulse generating element 14 may generate a positive pulse by controlling the valves 103_1-103_4 in the "G=0, H=1" status. Similarly, if an initial position of the membrane 102 within the current pulse cycle 114 is at the down position 108 and the membrane 102 is driven to the up position 107 at the end of the current pulse cycle 114, the air pulse generating element 14 may generate a positive pulse by controlling the valves 103_1-103_4 in the "G=1, H=0" status, or the air pulse generating element 14 may generate a negative pulse by controlling the valves 103_1-103_4 in the "G=0, H=1" status. In other words, the air pulse generating element 14 may arbitrarily generate a positive pulse (in the back-to-front direction), a negative pulse (in the front-to-back direction), or even a null pulse, regardless of the initial position of the membrane 102, or equivalently, the pulse polarity/direction of previous pulse cycle. That is, the polarity/direction of the air pulse corresponding to the current pulse cycle 114 is independent of the polarity/direction of the air pulse corresponding to the previous pulse cycle 114.

In addition, the time 113 in FIG. 4 represents a leading time of valve opening before the time instant 115, at which the membrane 102 is actuated within each pulse cycle 114. During the time 113, the corresponding valves (103_2 and 103_4 in this case) should be slightly opened to avoid situation that the membrane 102 is trying to push air out which causes difficulty in opening valve.

In short, the air pulse generating element 14 may arbitrarily produce a positive pulse, a negative pulse or a null pulse within a pulse cycle 114, independent of the polarity of previous air pulse, where the air mass velocity corresponding to the positive pulse and the air mass velocity corresponding to the negative pulse are in opposite directions. Specifically, when the air pulse generating element 14 produces the positive pulse, the air mass velocity is in the back-to-front direction; when the air pulse generating element 14 produces the negative pulse, the air mass velocity is in the front-to-back direction. When the air pulse generating element 14 produces the null pulse, the air pulse generating element 14 produces no air mass velocity.

Despite of the "−1" state and the "+1" state of the air pulse generating element 14, there is one additional "0" state, in which the membrane 102 stays idle/stable during the pulse cycle and therefore no air movement is produced. Specifically, within the pulse cycle 114, the membrane 102 may be controlled to hold its position, meaning that the membrane 102 does not move and being static during the first pulse cycle 114. In this case, the air pulse generating element 14 generates no air pulse or generates a null pulse during the pulse cycle 114 (corresponding to a "0" state), and the null pulse produces no air mass velocity.

Combining the "−1", "0" and "+1" states, audio data corresponding to the sound producing device 10 may utilize a base-3 representation. For example, since a decimal number 5 can be expressed as $5=9-3-1=+1\times3^2-1\times3^1-1\times3^0$, the base-3 representation of the decimal number 5 is (+1, −1, −1), where (+1, −1, −1) is corresponding to ($3^2$, $3^1$, $3^0$). Since a decimal number 35 can be expressed as $35=27+9-1=+1\times3^3+1\times3^2+0\times3^1-1\times3^0$, the base-3 representation of the decimal number 35 is (+1, +1, 0, −1), where (+1, +1, 0, −1) is corresponding to ($3^3$, $3^2$, $3^1$, $3^0$).

Figure 5:
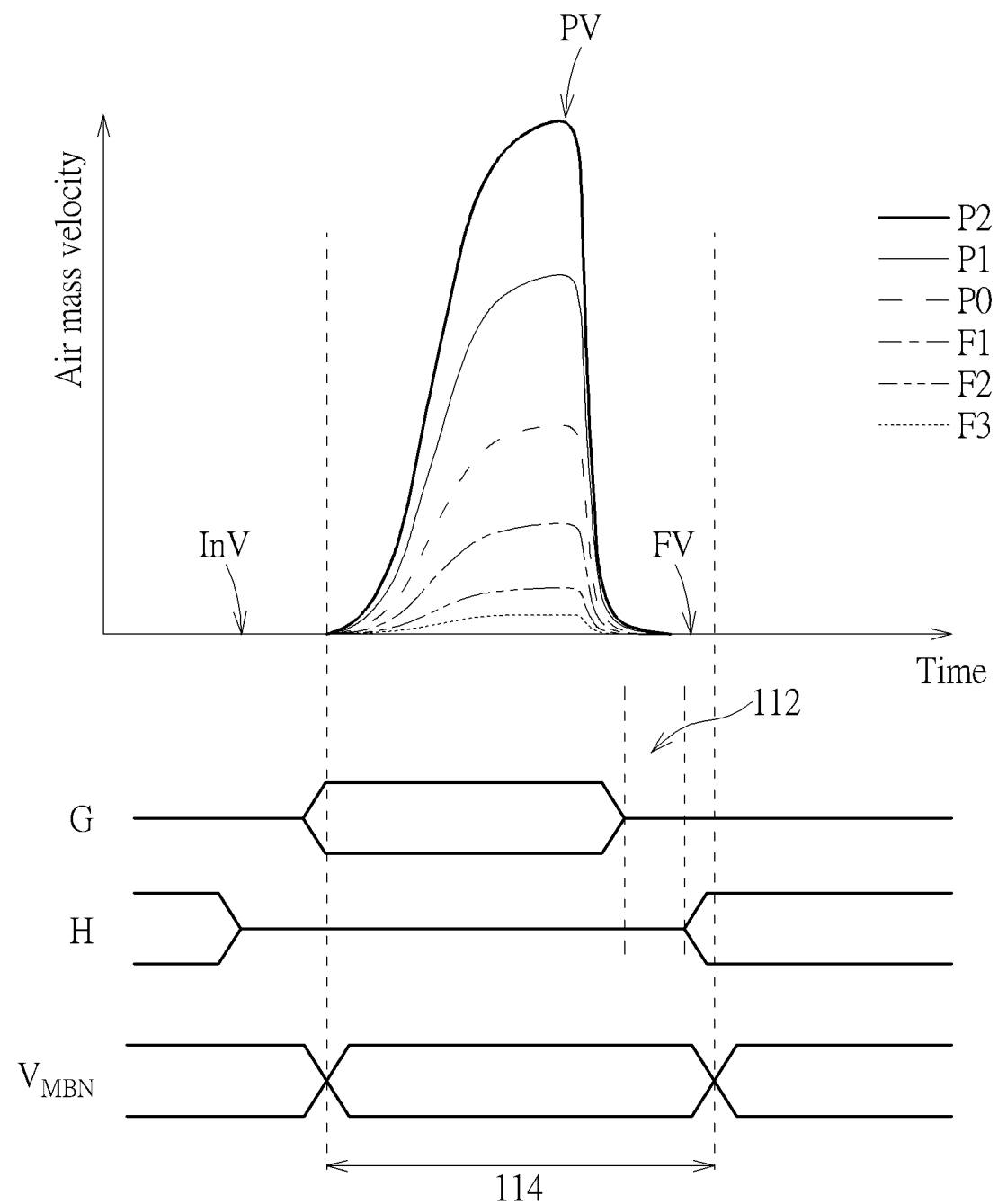
FIG. 5 is a schematic diagram of an air mass velocity according to an embodiment of the present invention.

Refer to FIG. 5, the air-flow in terms of air mass velocity generated by the sound producing device 10 during one air pulse cycle is illustrated. In the upper half of FIG. 5, multiple curves illustrated by different line styles represent different amplitudes of output waveforms (in terms of air speed, an integration result of air/sound pressure) corresponding to the air pulse generating groups P0, P1, P2, and F1-F3 within the sound producing device 10. For illustrative purpose, only output waveforms of the air pulse generating groups P0, P1, P2, and F1-F3 are shown, and output waveforms of the air pulse generating groups F4 and F5 are omitted. To illustrate the timing relationship specifically, a part of the timing diagram in FIG. 4 is reproduced in the lower half of FIG. 5. As shown in FIG. 5, within the air pulse cycle 114, the air-flow is accelerated after the valve (103_1 or 103_3 in this case) is opened, reaches the peak, stays relatively flat briefly and then drops back to zero as the valve is closed, at the end of the current air pulse cycle. Note that air speed decays to (approximately) 0 during the time 112 due to the closure of the valves 103_1-103_4. It means that, within each pulse cycle 114, the air mass velocity produced by the air pulse, is initiated from an initial value InV, increases and achieves a peak value PV, and decreases down to a final value FV. The initial value InV and the final value FV should be less than 10% of the peak value PV, and a difference between the initial value InV and the final value FV is less than 5% of the peak value PV. Preferably, the initial value InV and the final value FV is 0 or approximately 0.

Figure 6:
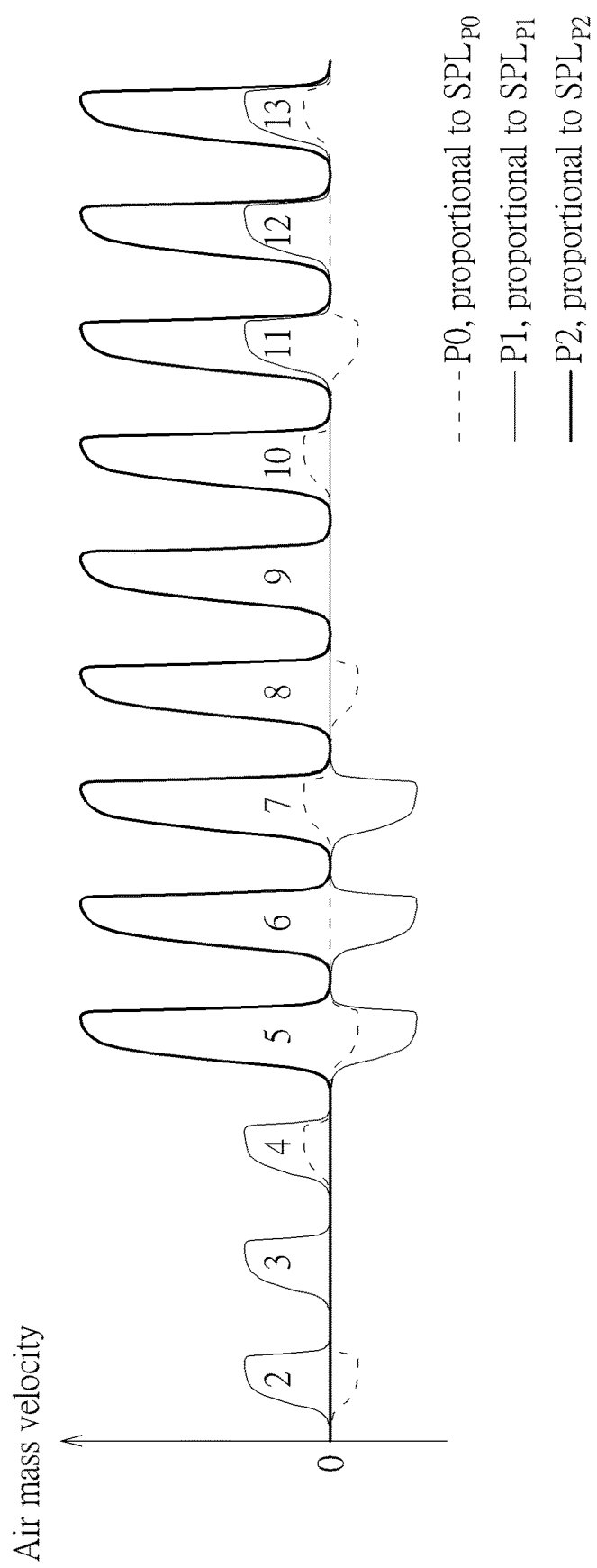
FIG. 6 is a schematic diagram of an air mass velocity according to an embodiment of the present invention.

Refer to FIG. 6, the air-flow speed, i.e., the air mass velocity, with respect to time produced by the air pulse generating groups P0, P1 and P2 over 12 consecutive air pulse cycles are shown. The amplitudes of SPL corresponding to the three air pulse generating groups P0, P1 and P2, denoted as $SPL_{P0}$, $SPL_{P1}$ and $SPL_{P2}$, have a ratio relationship of $SPL_{P0}:SPL_{P1}:SPL_{P2}=1:3:9$ in between. The "0" state representing "Speed=0" is omitted for brevity. Each air pulse generating group may arbitrarily generate a positive pulse (corresponding to the "+1" state), a negative pulse (corresponding to the "−1" state), or a null pulse (corresponding to the "0" state) within a certain pulse cycle 114, regardless of the polarity of previous air pulse. As FIG. 6 shows, the air pulse generating group P2 starts with 3 null pulses, and finishes with 9 consecutives positive pulses; the air pulse generating group P1 starts with 3 positive pulses, followed by 3 negative pulses and 3 null pulses, and finishes with 3 positive pulses; and the air pulse generating group P0 repeatedly generates a negative pulse, a null pulse and a positive pulse, in 4 iterations. Therefore, the resulting aggregated SPLs generated by the overall sound producing device 10, including the air pulse generating groups P0, P1 and P2, over the consecutive 12 cycles has a ratio of 2:3:4:5:6:7:8:9:10:11:12:13, as shown in scalar form in FIG. 6. In this regard, the UPA, i.e., the series/plurality of air pulses generated by the sound producing device 10 may be amplitude modulated. Note that, the SPL is a first-order derivative of air mass velocity with respect to time.

Similarly, the air pulse generating groups F1-F5 may be designed such that the amplitude of SPL generated by the air pulse generating group Fy (or the air pulse generating element within the air pulse generating group Fy) is $\frac{1}{3}^y$ of the $SPL_{P0}$, where y may be 1, . . . , 5. The fractional air pulse generating elements (i.e., the air pulse generating elements of the air pulse generating groups F1-F5) may be accomplished either by shrinking the geometry of the full cell (i.e., the air pulse generating element of the air pulse generating group P0), or by reducing the piezoelectric to membrane coverage ratio. For example, instead of nearly 100% coverage, the area of the actuator 101 may be shrunk to ½, or other ratio, of the membrane 102 and therefore reduce the peak displacements between the position 107 and 108. Thereby, the granularity of the amplitude of SPL generated by the entire sound producing device 10 may be further refined. Specifically, the entire sound producing device 10 may produce $$1 = 2 \cdot \sum_{i=0}^{7} 3^i = 6,561$$

quantization SPL levels.

Figure 7:
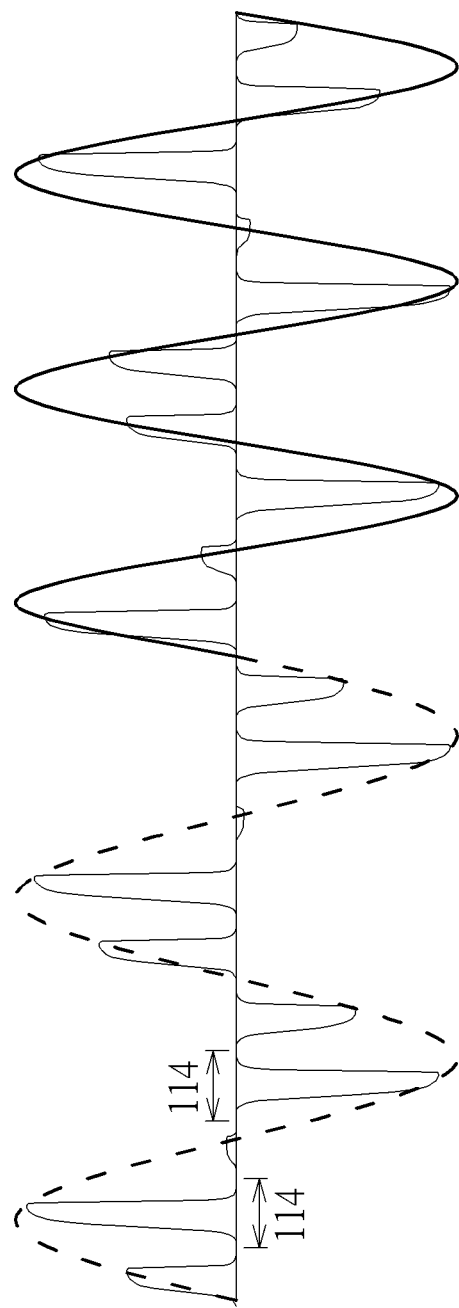
FIG. 7 is a schematic diagram of an air mass velocity according to an embodiment of the present invention.

Refer to FIG. 7, a pulse array or a series/plurality of air pulses generated by the sound producing device 10 according to a sinusoidal sound wave is illustrated. A plurality of air pulses, shown in solid line, is generated over a plurality of fixed cycles 114. An amplitude and a polarity of each pulse are related to an amplitude and a polarity of a sample of the sinusoidal sound wave. In other words, the plurality of air pulses generated by the sound producing device 10 is regarded as being amplitude-modulated (AM) according to the sinusoidal sound wave. Similarly, the plurality of air pulses generated by the sound producing device 10 may be amplitude-modulated according to an input audio signal, which means that an amplitude and a polarity of each pulse are related to an amplitude and a polarity of a time-sample of the input audio signal, wherein the time-sample of the input audio signal represents an instantaneous value of the input audio signal sampled at a sampling time instant.

Furthermore, volume of air moved by the plurality of air pulses generated by the sound producing device 10 is substantially inverse proportional to an audio frequency of the input audio signal. As can be seen from FIG. 7, the sound wave envelope has two portions, where a frequency of the right portion (bold solid line) is about 1.5 times of which of the left (bold dashed line). As expected, that the number of pulses per sound wave period on the left is about 1.5 times higher than which on the right.

Figure 8:
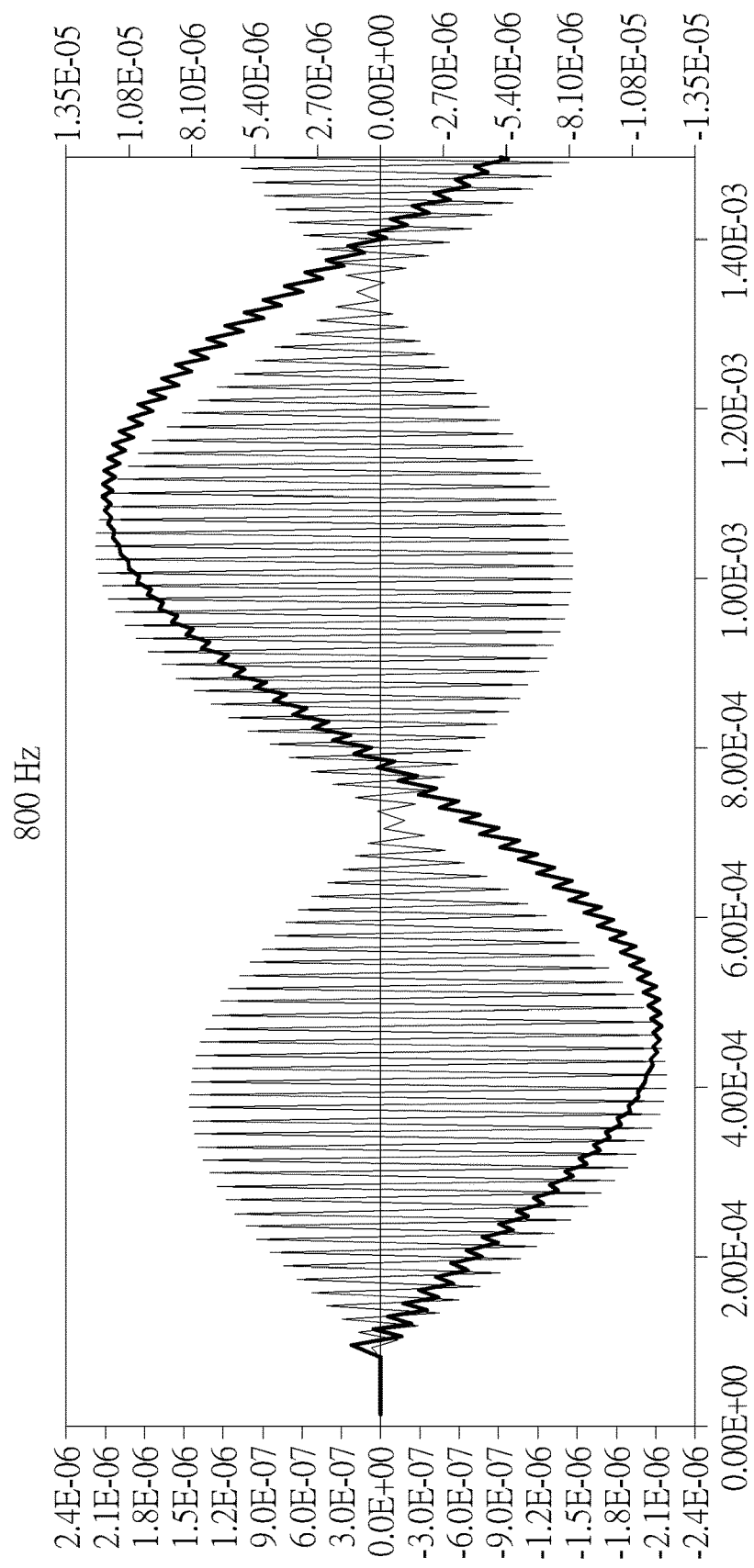
FIG. 8 is a schematic diagram of a sound pressure level (SPL) according to an embodiment of the present invention.
Figure 9:
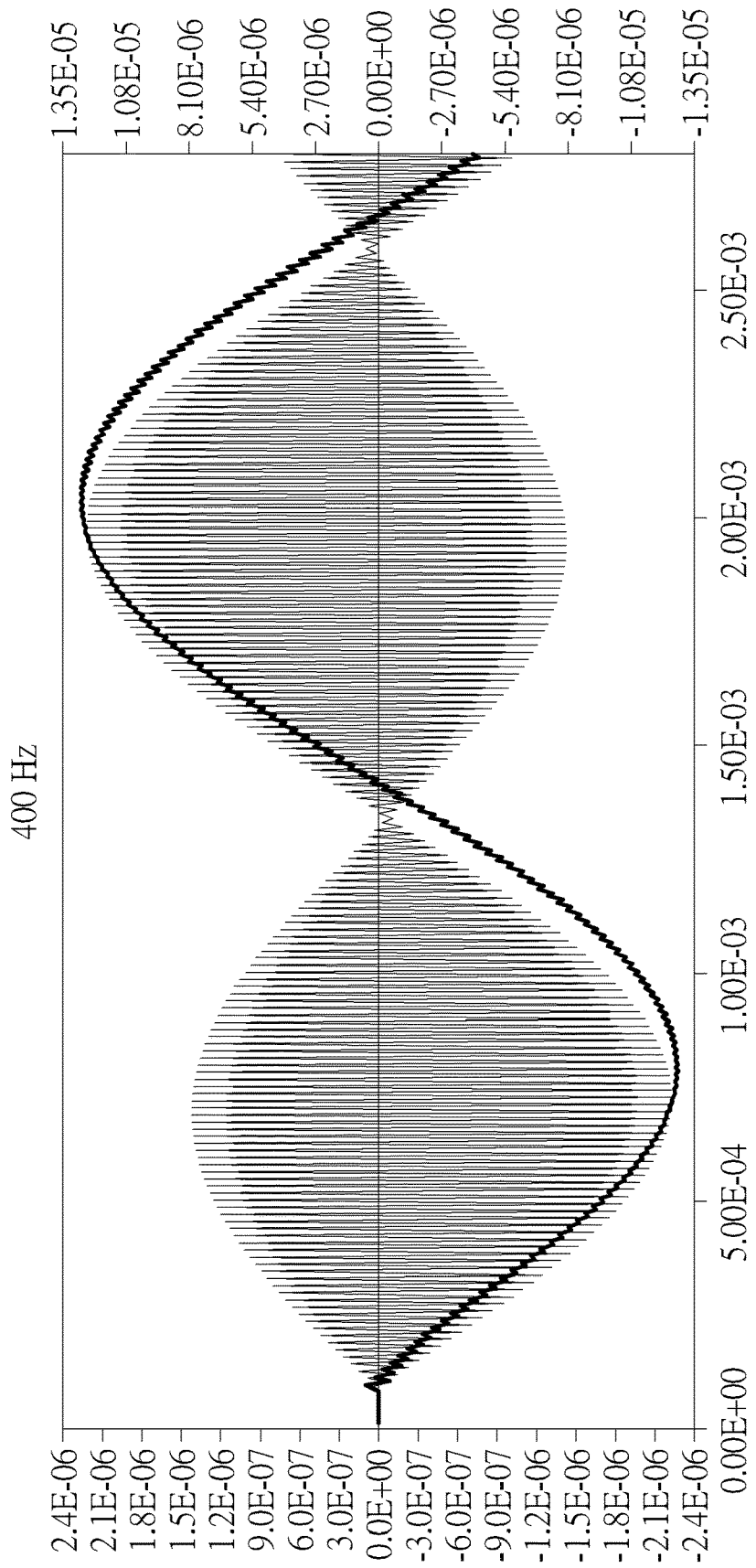
FIG. 9 is a schematic diagram of an SPL according to an embodiment of the present invention.

To elaborate more, please refer to FIG. 8 and FIG. 9. FIG. 8 and FIG. 9 illustrate FEM (Finite Element Method) simulation results of a plurality of air pulses in terms of sound pressure generated according to a first single-tone input signal with 800 Hz and a second single-tone input signal with 400 Hz, respectively. The thin lines illustrate the instantaneous SPL produced by the plurality of air pulses, and the bold lines represent low-pass filtered results of the SPL of the plurality of air pulses. In FIG. 8 and FIG. 9, the scale of the low-pass filtered results is referred to the left vertical axis and the scale of the instantaneous SPL produced by the plurality of air pulse is referred to the right vertical axis. In FIG. 8 (FIG. 9), a first (second) period of the first (second) single-tone input signals, a reciprocal of a frequency of the first (second) single-tone input signal, is illustrated. As shown in FIG. 8 and FIG. 9, a first number of a plurality of air pulses within a first period is less than a second number of a plurality of air pulses within a second period. The second number is approximately twice of the first number. Suppose that the first single-tone input signal and the second single-tone input signal have the same amplitude, a second air volume moved by the plurality of air pulses within the second period is approximately twice of a first air volume moved by the plurality of air pulses within the first period. In other words, for a specific sound output SPL, the volume of air moved by the plurality of air pulses is related to a reciprocal of an audio frequency of the input audio signal. That is, for the specific SPL, an air movement $V_{A,APS}$ caused by the air pulse generating element 14 is proportional to $1/f$, i.e., $V_{A,APS} \propto 1/f$ (eq-4).

Since the air movement caused by the air pulse generating element 14 for a certain SPL is proportional to $1/f$, instead of $1/f^2$ as by the conventional speaker drivers, the air movement produced by the air pulse generating element 14 is much less than which produced by the conventional speakers, especially for low audio frequency. For example, for a specific SPL, such as 95 dB, the air movement $V_{A,APS}$ produced by the air pulse generating element 14 at 40 Hz is 300 times of which at 12 KHz (because of 12K/40=300). On the other hands, the air movement $V_{A,CV}$ produced by a conventional speaker driver at 40 Hz is $300^2$ times of which at 12 KHz. As the audio frequency goes lower, the disparity between $V_{A,APS}$ and $V_{A,CV}$ is higher. Recall that the low frequency fidelity of the speaker is sensitive to the ratio $V_A/V_{EN}$ (where $V_{EN}$ denotes the volume of the enclosure) and given that $V_{A,APS}$ is much less than $V_{A,CV}$ for low audio frequency, it implies that the volume of the enclosure for the sound producing device 10 can also be reduced by the same ratio $V_{A,APS}$ has reduced relative to $V_{A,CV}$. That is, the volume of the enclosure of the present application, required to achieve the same level low frequency fidelity, is significantly reduced.

Figure 10:
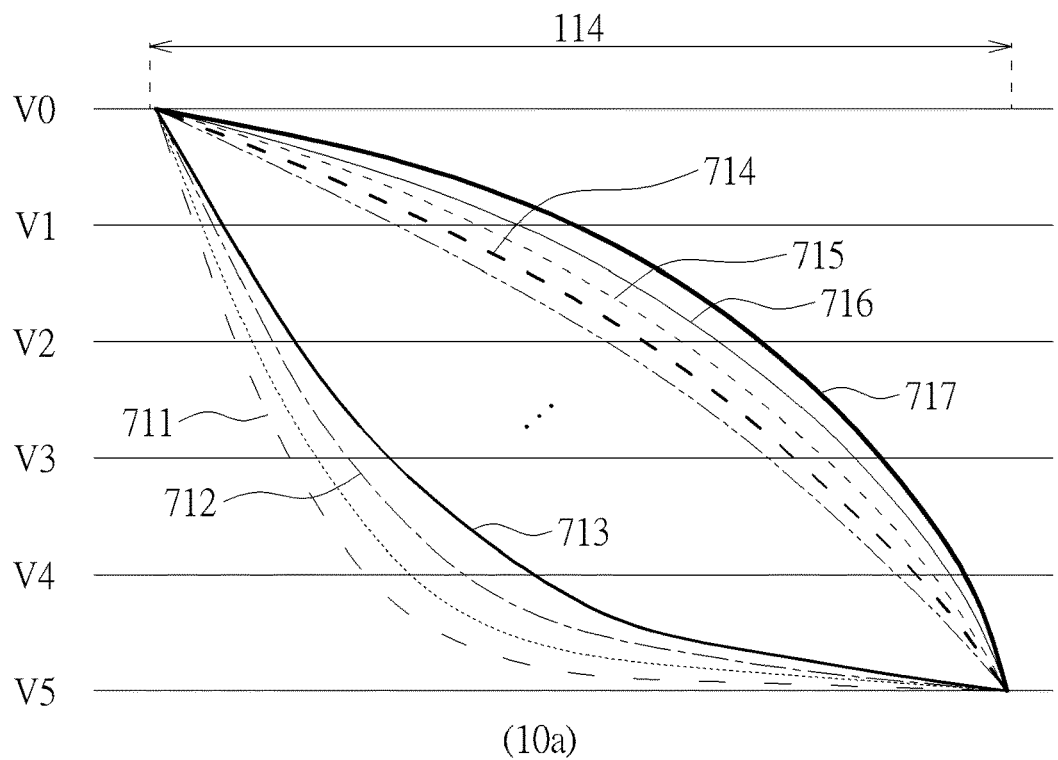
FIG. 10 is a schematic diagram of voltage profile of driving voltages according to an embodiment of the present invention.
Figure 10:
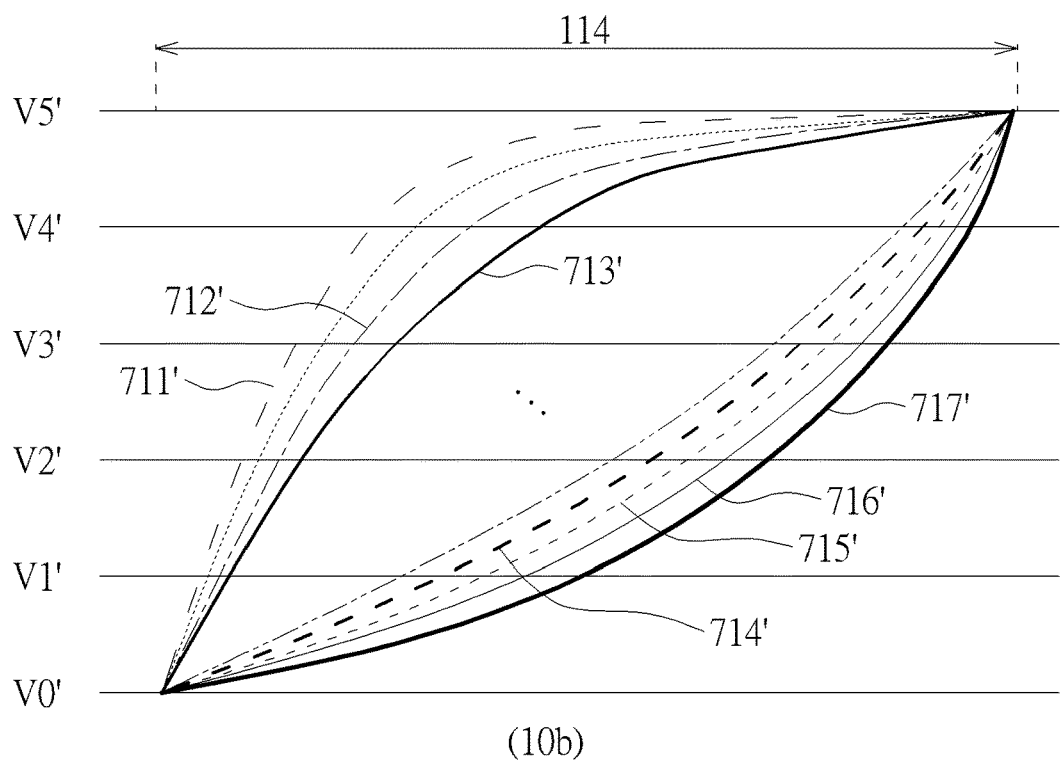

Referring to FIG. 10, a set of driving voltages $V_{MBN}$ suitable for driving the electrodes 101_a and 101_b, within the actuator 101 illustrated in FIG. 3, are shown. In subfigure 10a, the voltage curves 711-713 decrease rapidly (from V1 to V3) at the beginning of the cycle and then turn into a tapering curve (from V3 to V5). In contrast, the voltage curves 714-717 decrease gently at the beginning and negatively accelerate rapidly toward the end of the cycle. In subfigure 10b, the voltage curves 711'-713' increase rapidly (from V1' to V3') at the beginning of the cycle and then turn into a tapering curve (from V3' to V5'). In contrast, the voltage curves 714'-717' increase gently at the beginning and positively accelerate rapidly toward the end of the cycle. Simulation results show that applying the voltage curves 714-717 and 714'-717' as the driving voltage $V_{MBN}$ provides better SPL results than applying the voltage curves 711-713 and 711'-713'.

Figure 11:
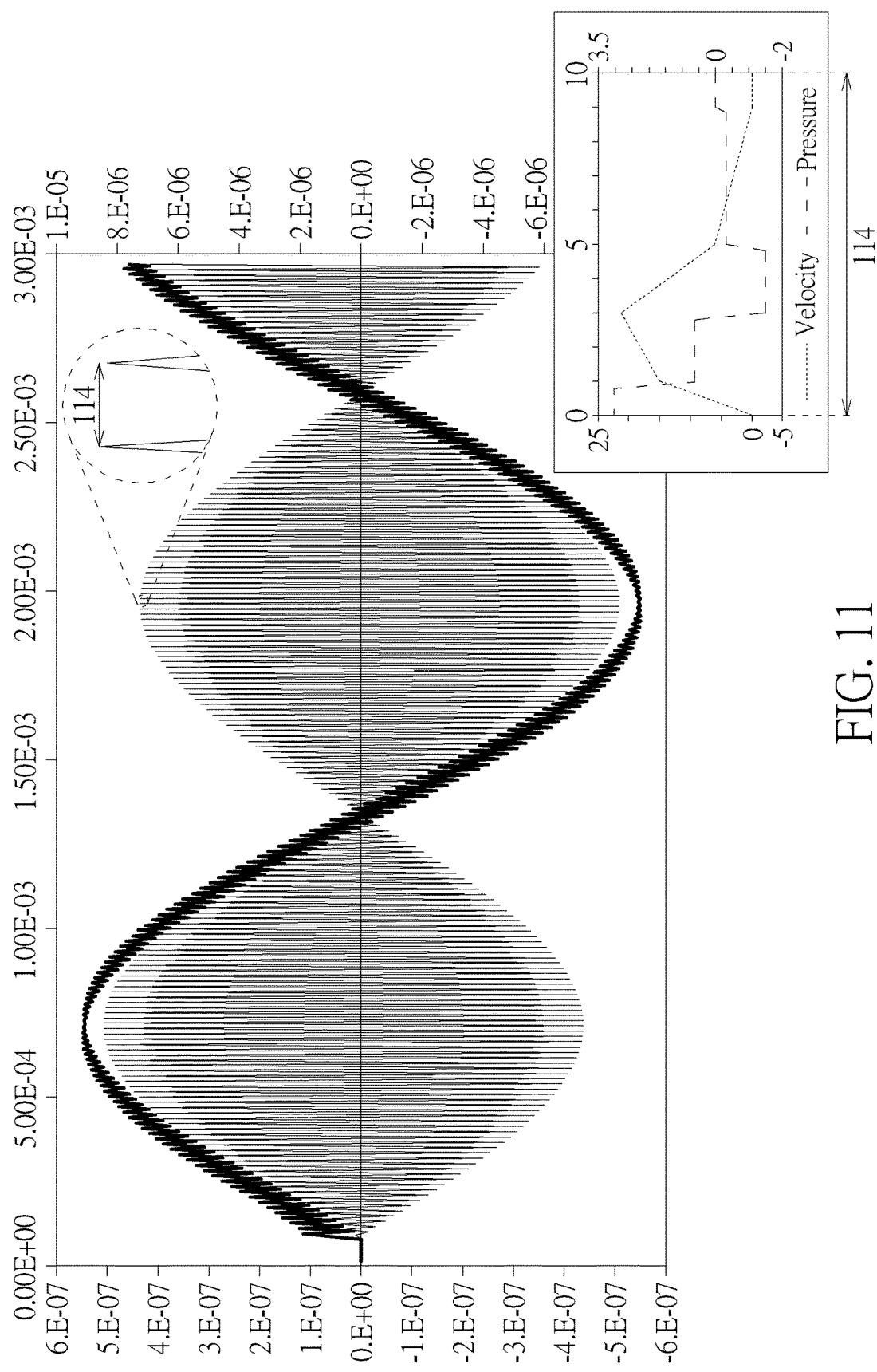
FIG. 11 is a schematic diagram of an SPL according to an embodiment of the present invention.
Figure 12:
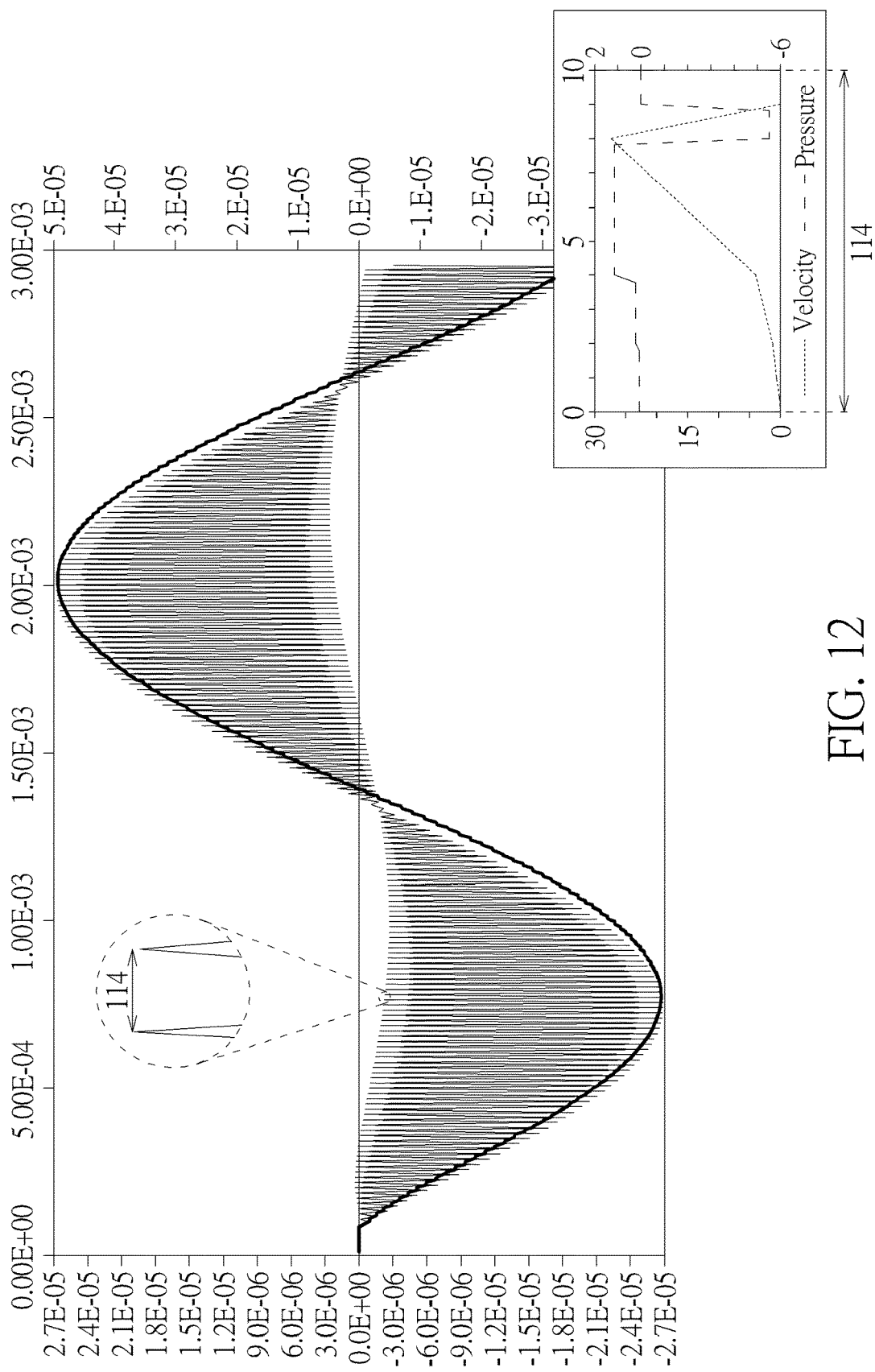
FIG. 12 is a schematic diagram of an SPL according to an embodiment of the present invention.

Referring to FIG. 11 and FIG. 12, FEM (Finite Element Method) simulation results are provided. The thin lines represent instantaneous SPLs, consisted of a plurality of air pulses, measured about 5 wavelengths (e.g., 26 mm) away from the UPA generating device (e.g., the sound producing device 10 with the air pulse generating elements 14), where the scale of the instantaneous SPLs is shown at the right. The bold lines represent low pass filtered SPLs of the instantaneous SPLs, where the scale of the low pass filtered SPLs is shown at the left. Note that, the low pass filtered SPL would be closed to the sound perceived by human since the ambient environment (such as draped windows, textured ceiling, paneled walls, carpeted floor), bouncing off soft tissue of human ear, propagating through the ear canals and producing vibration through the eardrum cause a low pass filtering effect. On the lower-right corner of FIG. 11 and FIG. 12, air velocity and air pressure profiles applied by the membrane within one pulse cycle 114 are illustrated, where the dashed lines represent the pressure profile and the dotted lines represent the velocity profile.

The simulation scenario, such as the source signal (e.g., 400 Hz sinusoidal wave signal source), the membrane dimension, the membrane displacement and the air pulse cycle are all the same for FIG. 11 and FIG. 12. Difference between FIG. 11 and FIG. 12 is merely the pressure profile applied by the membrane. The pressure profile, shown in the lower-right corner, of FIG. 11 is high at the beginning of the cycle 114 and relatively low at the rest of the cycle. On the other hand, the pressure profile, shown in the lower-right corner, of FIG. 12 increases gently at the beginning of the cycle 114. Until the air speed follows up, i.e., increases to certain level, the velocity profile accelerates rapidly. As can be seen from FIG. 11 and FIG. 12, the resulting low pass filtered SPLs of FIG. 12 is about 48 times in scale of which of FIG. 11.

It can be observed from FIG. 11 and FIG. 12, controlling the pressure profile applied by the membrane 102 is critical to the resulting SPL. Referring back to the FIG. 10, applying the voltage curves 711-713 or 711'-713' as the driving voltage $V_{MBN}$ would produce pressure profile similar to the one shown in FIG. 11, and applying the voltage curves 714-717 or 714'-717' as the driving voltage $V_{MBN}$ would produce pressure profile similar to the one shown in FIG. 12, which outperforms over which of FIG. 11. In other words, it is preferably to apply the driving voltage $V_{MBN}$ to the actuator 101 in an increasing and positively accelerating manner within a beginning portion of the pulse cycle.

It can be concluded that the driving voltage $V_{MBN}$ is preferably in a positively accelerating manner when the driving voltage $V_{MBN}$ is in an increasing manner within the pulse cycle 114, and the driving voltage $V_{MBN}$ is preferably in a negatively accelerating manner when the driving voltage $V_{MBN}$ is in a decreasing manner within the pulse cycle 114.

Mathematically, suppose that time instants $t_1$, $t_2$, $t_3$ and $t_4$ within the beginning portion of the cycle 114 with $t_1 < t_2 < t_3 < t_4$ and $t_2 - t_1 = t_4 - t_3 = \Delta t > 0$, $V_{MBN}(t_1)$ $V_{MBN}(t_2)$ $V_{MBN}(t_3)$ and $V_{MBN}(t_4)$, respectively, are instantaneous values of the driving voltage $V_{MBN}$ at the time instants $t_1$, $t_2$, $t_3$ and $t_4$. The increasing manner of driving voltage $V_{MBN}$ represents that $V_{MBN}(t_1) < V_{MBN}(t_2) <_{MBN}(t_3) < V_{MBN}(t_4)$. The positively accelerating manner of driving voltage $V_{MBN}$ represents that an increment of $V_{MBN}$ within time period/segment $[t_1, t_2]$ is less than an increment of $V_{MBN}$ within time period/segment $[t_3, t_4]$, i.e., $(V_{MBN}(t_2) - V_{MBN}(t_1))/\Delta t < (V_{MBN}(t_4) - V_{MBN}(t_3))/\Delta t$. The decreasing manner of driving voltage $V_{MBN}$ represents that $V_{MBN}(t_1) > V_{MBN}(t_2) > V_{MBN}(t_3) > V_{MBN}(t_4)$. The negatively accelerating manner of driving voltage $V_{MBN}$ represents that a decrement of $V_{MBN}$ within time period/segment $[t_1, t_2]$ is less than a decrement of $V_{MBN}$ within time period/segment $[t_3, t_4]$ i.e., $|V_{MBN}(t_2) - V_{MBN}(t_1)|/\Delta t < |V_{MBN}(t_4) - V_{MBN}(t_3)|/\Delta t$, where $||$ represents an absolute value operator.

In another perspective, the air pulses in FIG. 12 have more "offset" than those the FIG. 11, where the "offset" may be viewed as the deviation of the mean pressure within the cycle 114 from zero level. The air pulses in FIG. 11 barely have offset, and the air pulses in FIG. 12 have significant offset. The offset of the air pulses are greatly affected by the pressure profile applied by the membrane 102, and such offset will in turn affect the resulting audible sound output SPL. When the offset is small relative to the pulse amplitude, as FIG. 11, the low pass filtered SPL tends to be relatively small. When offset is close to or even larger than the amplitude of air pulse, as FIG. 12, the low pass filtered SPL is enhanced significantly.

As can be observed from the above discussion, the SPL output of each air pulse generating group within the sound producing device 10 are actually individual air pulses, not "ultrasonic waves", because the zero-mean-flow assumption, one of the axioms of classic acoustic theorem, has been broken by the existence of the offset of UPA.

A key reason for the sound producing device 10 to produce a pulse array, instead of a wave, is that, during the time 112 of each cycle 114, all the valves 103_1-103_4 are closed, so as to produce a "membrane-clamping action" through the air within the air pulse generating element 14. This clamping action stated in the above would snuff off "membrane vibration" from one cycle to the next. No matter whether the next air pulse cycle is producing a positive pulse, a negative pulse or a null pulse, there will be no interactions and no memory effect between any two subsequent cycles.

By generating the control signals by the control unit 12, the sound producing device 10 will generate an UPA (i.e., the series of air pulses) where the amplitude of each pulse (in terms of SPL) are modulated according to the input audio signal, resulting in the pulses and their corresponding envelops illustrated in FIGS. 7-9 and 11-12. The amplitude-modulated air UPA will then leave the sound producing device 10 and travels/propagates outward. During such travel/propagation, the emitted UPA will interact with the ambient objects such as wall, window, window dressing, carpet and floor, ceiling, etc. The resulting/remaining UPA which reaches the listeners' ear will then pass through human ear structure, from the outer ear, through the ear canal and the eardrum, to the malleus, incus and stapes. These ambient objects and human ear passages perform a certain degree of low pass filtering effect by absorbing/destructing high frequency vibrations. That is, the low-pass filtering effects will remove most of the high frequency components which is either at or above the pulse rate, and the sound perceived by human will be the frequency component corresponding to the input/source audio signal inputted to the control unit 12. Therefore, the sound producing device 10, as a single speaker driver, is able to produce a high-fidelity sound covering the full range of human audible frequency, overcoming one of the most difficult challenges of the conventional speaker drivers. Details of operations from the input audio signal to the amplitude-modulated pulse arrays are described as follows.

Recall that the audio data may be presented by the base-3 representation, the control unit 12 converts an input audio signal AUD into its base-3 representation. Ternary system, instead of binary system, is utilized in the control unit 12. Each trit value, analogous to bit value in binary system, of the base-3 system may be of −1, 0 or +1. For each pulse cycle 114, the control unit 12 generates trit values $TRV_7$, $TRV_6$, ..., $TRV_0$ according to an time-sample of the input audio signal AUD, where the trit value $TRV_i$ may be −1, 0 or +1 for i=0, ..., 7. After the trit values $TRV_7$, $TRV_6$, $TRV_5$, $TRV_0$ is generated, the control unit generates the driving voltages $V_{P2}$, $V_{P1}$, $V_{P0}$, $V_{F1}$, ..., $V_{F5}$ correspondingly, where the driving voltage $V_{PX}$ is corresponding to $TRV_{x+5}$ and the driving voltage $V_{Fy}$ is corresponding to $TRV_{5-y}$, for x=0, 1, 2 and y=1, ..., 5.

Figure 13:
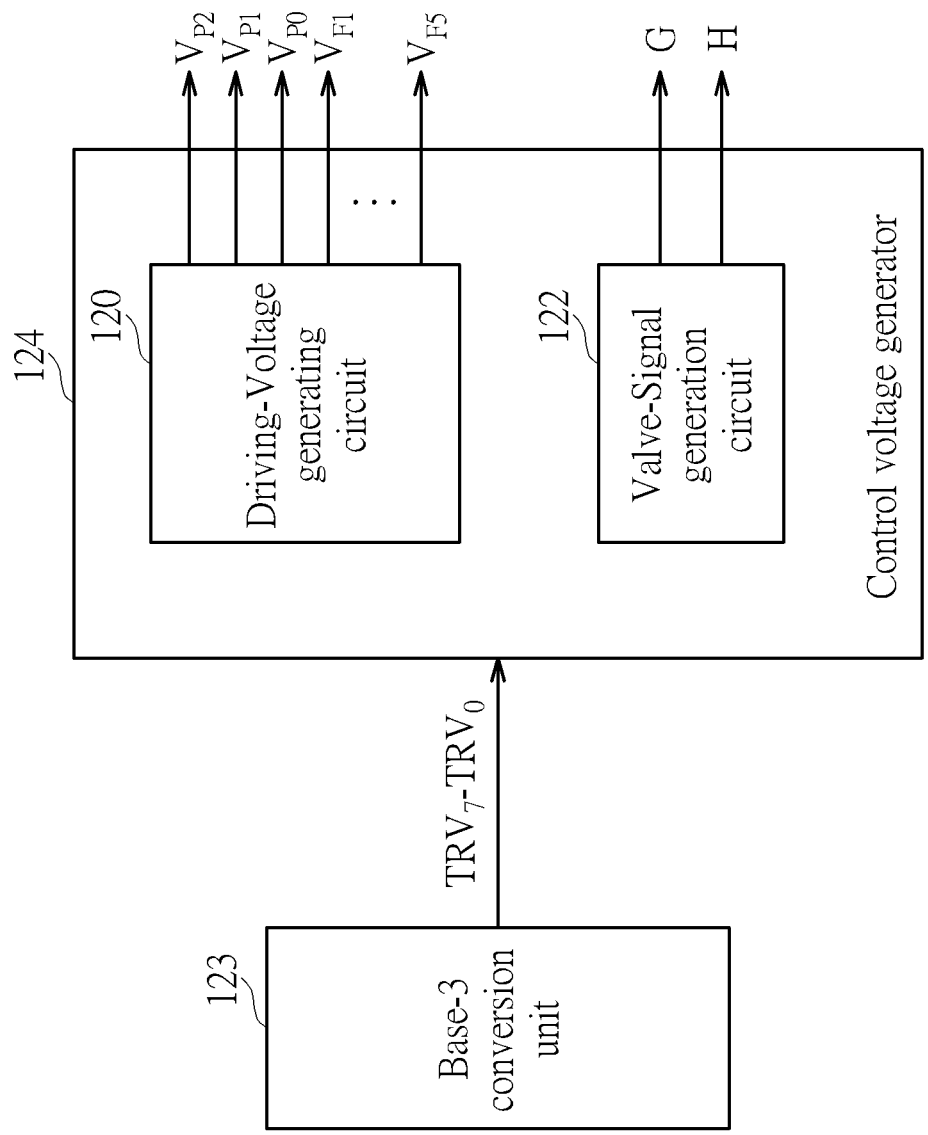
FIG. 13 is a schematic diagram of a control unit according to an embodiment of the present invention.

Refer to FIG. 13, a schematic diagram of the control unit 12 according to the current invention is illustrated. The control unit 12 comprises a base-3 conversion unit 123 and a control voltage generator 124, and the control voltage generator 124 comprises a driving-voltage generating circuit 120 and a valve-signal generating circuit 122. The base-3 conversion unit 123 is configured to convert an time-sample of the input audio signal AUD as the trit values $TRV_7$, $TRV_6$, ..., $TRV_0$, where $TRV_7$ is the most significant trit (MST), analogous to most significant bit (MSB) in the binary system, and $TRV_0$ is the least significant trit (LST), analogous to least significant bit (LSB) in the binary system.

The driving-voltage generating circuit 120 may generate the driving voltages $V_{P0}$-$V_{P2}$ and $V_{F1}$-$V_{F5}$, where the driving voltages $V_{P0}$-$V_{P2}$ and $V_{F1}$-$V_{F5}$ represent the driving voltage $V_{MBN}$ applied to the air pulse generating groups P0-P2 and F1-F5, respectively, and serves as the driving voltage $V_{MBN}$ for the air pulse generating element 14 within the air pulse generating groups P0-P2 and F1-F5. The valve-signal generating circuit 122 is configured to generate the valve-controlling signals G and H.

For the trit values $TRV_7$, $TRV_6$, $TRV_5$, i.e., for the trit value $TRV_i$ with i=7, 6, 5, the trit value $TRV_i$=+1 means that the air pulse generating element 14 within the air pulse generating group P(i-5) generates a positive air pulse, the trit value $TRV_i$=−1 means that the air pulse generating element 14 within the air pulse generating group P(i-5) generates a negative air pulse, and the trit value $TRV_i$=0 means that the air pulse generating element 14 within the air pulse generating group P(i-5) generates a null pulse. In other words, when the base-3 conversion unit 123 generates the trit value $TRV_i$ as $TRV_i$=+1, the control voltage generator 124 generates the driving voltage $V_{P(i-5)}$ and the valve-controlling signals G, H to the air pulse generating element 14 within the air pulse generating group P(i-5), such that the air pulse generating element 14 within the air pulse generating group P(i-5) generates the positive air pulse. When the base-3 conversion unit 123 generates the trit value $TRV_i$ as $TRV_i$=−1, the control voltage generator 124 generates the driving voltage $V_{P(i-5)}$ and the valve-controlling signals G, H to the air pulse generating element 14 within the air pulse generating group P(i-5), such that the air pulse generating element 14 within the air pulse generating group P(i-5) generate the negative air pulse. When the base-3 conversion unit 123 generates the trit value $TRV_i$ as $TRV_i$=0, the control voltage generator 124 generates the driving voltage $V_{P(i-5)}$ to remain constant within the pulse cycle 114, such that the membrane 102 of the air pulse generating element 14 within the air pulse generating group P(i-5) remains static within the pulse cycle 114.

For the trit values $TRV_4$, $TRV_3$, $TRV_2$, $TRV_1$, $TRV_0$, i.e., for the trit value $TRV_i$ with i=4, ... 0, the trit value $TRV_i$=+1 means that the air pulse generating element 14 within the air pulse generating group F(5-i) generates a positive air pulse, the trit value $TRV_i$=−1 means that the air pulse generating element 14 within the air pulse generating group F(5-i) generates a negative air pulse, and the trit value $TRV_i$=0 means that the air pulse generating element 14 within the air pulse generating group F(5-i) generates a null pulse. In other words, when the base-3 conversion unit 123 generates the trit value $TRV_i$ as $TRV_i$=+1, the control voltage generator 124 generates the driving voltage $V_{F(5-i)}$ and the valve-controlling signals G, H to the air pulse generating element 14 within the air pulse generating group F(5-i), such that the air pulse generating element 14 within the air pulse generating group F(5-i) generates the positive air pulse. When the base-3 conversion unit 123 generates the trit value $TRV_i$ as $TRV_i$=−1, the control voltage generator 124 generates the driving voltage $V_{F(5-i)}$ and the valve-controlling signals G, H to the air pulse generating element 14 within the air pulse generating group F(5-i), such that the air pulse generating element 14 within the air pulse generating group F(5-i) generate the negative air pulse. When the base-3 conversion unit 123 generates the trit value $TRV_i$ as $TRV_i$=0, the control voltage generator 124 generates the driving voltage $V_{F(5-i)}$ to remain constant within the pulse cycle 114, such that the membrane 102 of the air pulse generating element 14 within the air pulse generating group F(5-i) remains static within the pulse cycle 114.

Figure 14:
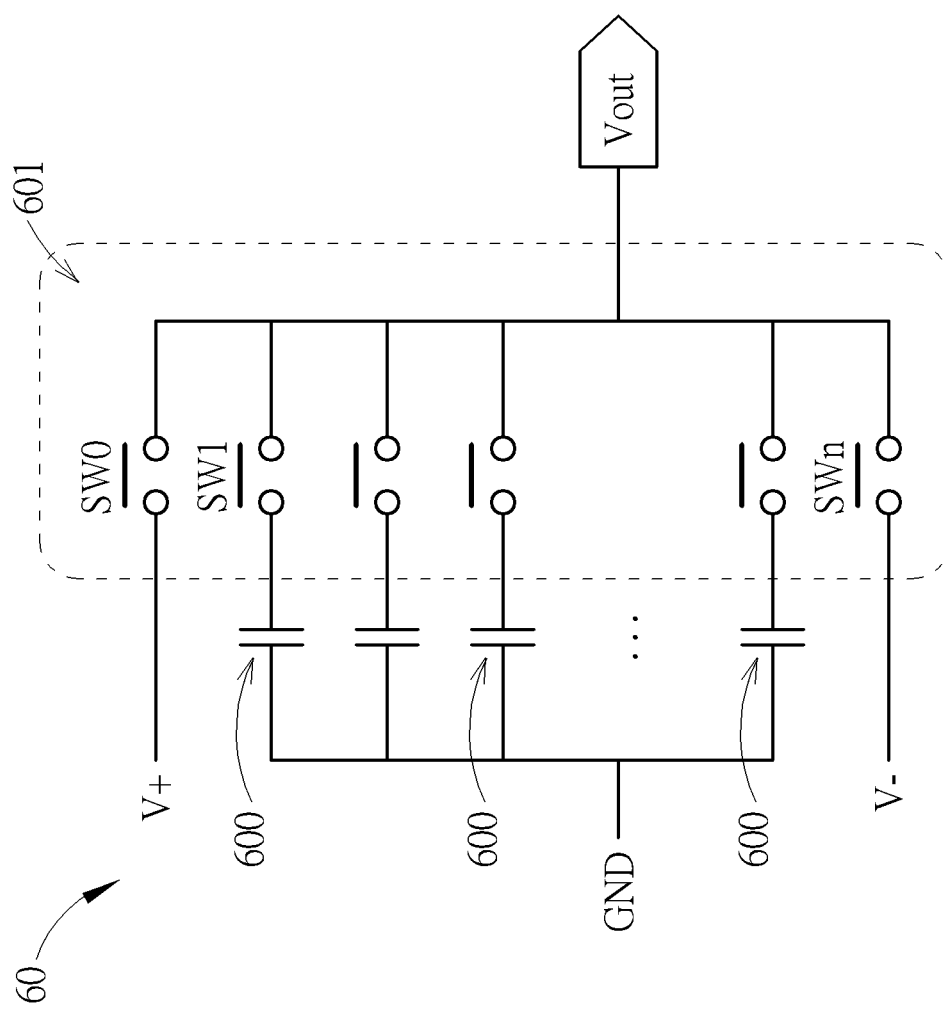
FIG. 14 is a schematic diagram of a part of a driving-voltage generating circuit according to an embodiment of the present invention.
Figure 15:
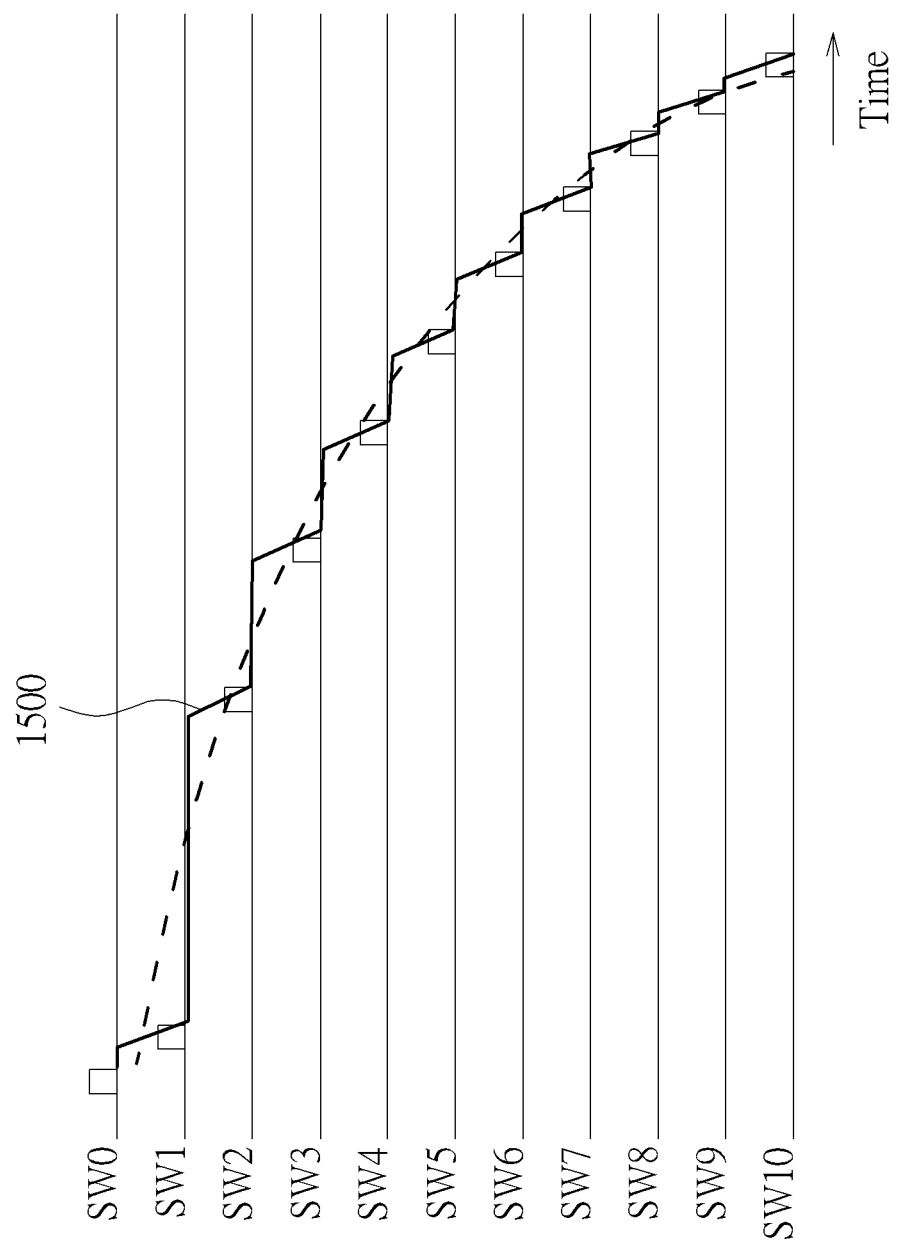
FIG. 15 is a timing diagram of the circuit in FIG. 14.

Refer to FIG. 14 to FIG. 15, the schematic diagram of a switching circuit 60 and its corresponding timing diagram and output are illustrated. The switching circuit 60, a multi-level charge-recovering voltage source (CRVS), may be used to implement a part of the driving-voltage generating circuit 120, which is to generate one of the driving voltages $V_{P0}$-$V_{P2}$ and $V_{F1}$-$V_{F5}$. As shown in FIG. 14, the switching circuit 60 comprises (n−1) external charge storage capacitors 600 where each capacitor's capacitance is at least 10 times larger than the sum of total loading capacitance of the sound producing device 10, i.e., the loading capacitance formed by the actuator 101. Each of the (n−1) capacitors 600 is connected to a switch in the switch network 601 for generating the voltage Vout, where the voltage Vout represents one of the driving voltages $V_{P0}$-$V_{P2}$ and $V_{F1}$-$V_{F5}$. The switch network 601 contains (n+1) switches. The operation of switch network 601 is analogous to elevator, as illustrated in the timing diagram in FIG. 15. In an example illustrated in FIG. 15, a 9-capacitor CRVS is used to generate an 11-level membrane actuator driving voltage $V_{MBN}$ as shown in bold solid line (i.e., the voltage curve 1500). The driving voltage $V_{MBN}$ corresponds to one cycle 114. When the voltage curve 1500 is applied to the electrodes 101_a and 101_b, it would produce one cycle of the pressure profile as illustrated in the lower-right corner of FIG. 11 and FIG. 12.

Furthermore, an enhance-resolution CRVS (CRVSER) scheme/mechanism may be utilized. Different from CRVS mechanism, the CRVSER is based on RC (resistor-capacitor) charging mechanism. By taking advantage of the RC delays caused by the capacitive loading, CRSVER utilizes short pulses to control the switches within the switch network 601 such that the transition between the storage capacitor $C_X$, representing the storage capacitor 600 corresponding to the $SW_x$, and the storage capacitor $C_{X+1}$, representing the storage capacitor 600 corresponding to the $SW_{x+1}$, is split into m sub-steps.

Figure 16:
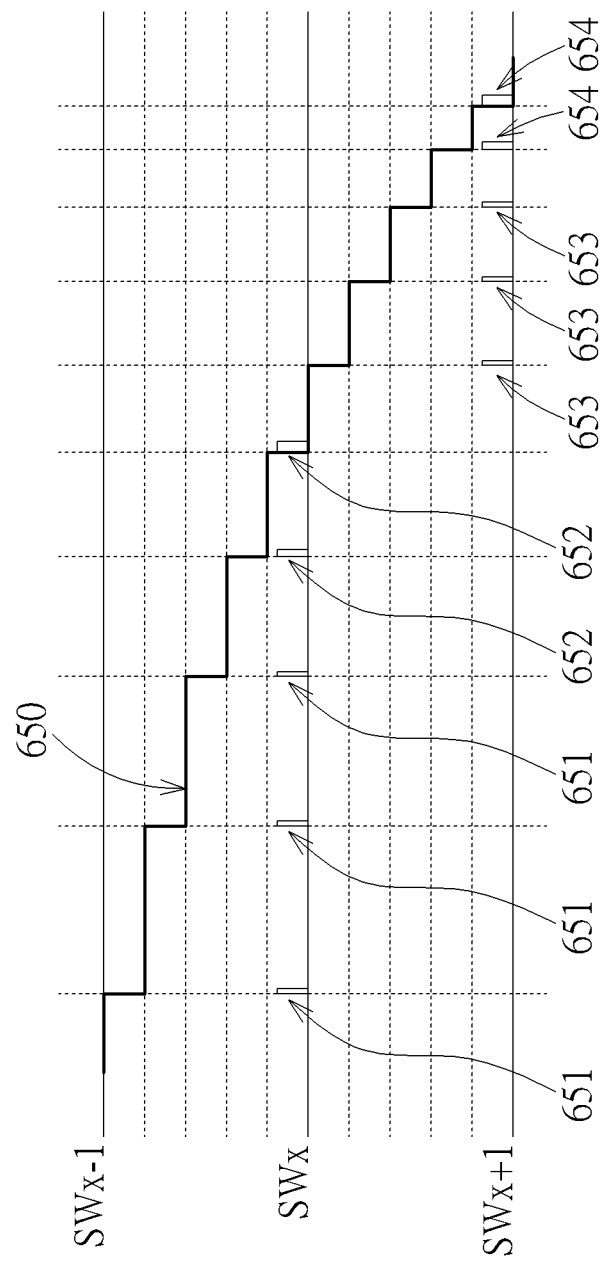
FIG. 16 is a timing diagram of an enhance-resolution charge-recovering voltage (CRVSER) based circuit according to an embodiment of the present invention.

For example, referring to FIG. 16, a voltage profile provided by CRVSER scheme/mechanism is illustrated. As shown in FIG. 16, the voltage between $C_{X-1}$, $C_x$ and $C_{X+1}$ are split into two groups of 5 sub-steps. By properly selecting the switch timing and the values of corresponding resistors, a 10-step curve generated using just 1 external storage capacitor, which is simplified from the original CRVS scheme of FIG. 15.

In addition, due to the flattening/smoothening of RC curve as the capacitor charging progresses, the sub-steps may be unevenly distributed if the switch control timing stays constant. To compensate for this, it is desirable to have the switch ON duration start short and gets progressively longer as the RC charging approaches saturation. Such changing on the ON duration is illustrated by pulse widths 651 versus pulse widths 652, or by pulse widths 653 versus pulse widths 654, where the three pulses in 651/653 may have shorter duration of roughly 0.7×, 0.8×, 1× time unit respectively, while durations of the pulses in 652/654 may be roughly 1.5× and 2.5× time units respectively.

Figure 17:
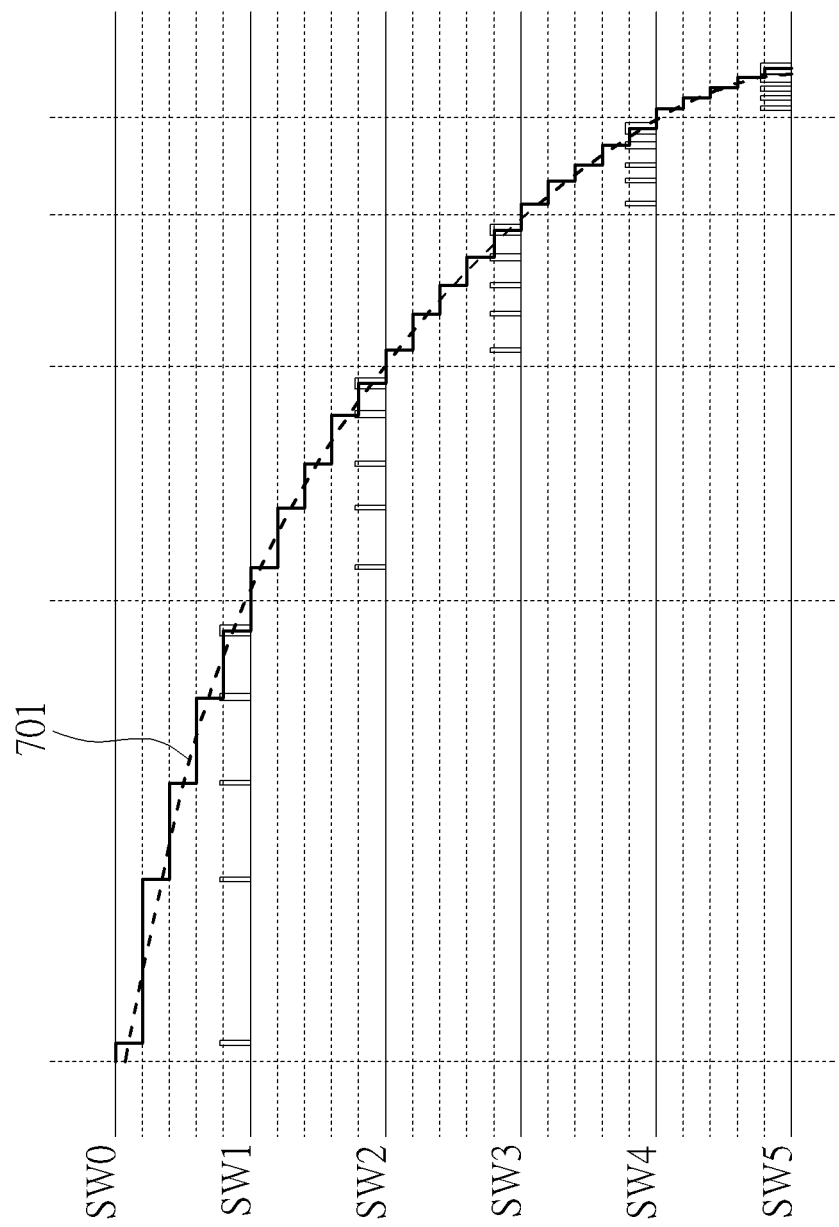
FIG. 17 is a timing diagram of a CRVSER-based circuit according to an embodiment of the present invention.

Refer to FIG. 17, a fine-grained 26-level driving voltage curve generated by using 4-capacitor CRVSER is shown. Due to the application of CRSVER scheme, the CRSVER generated curve approximates the desired smooth curve 701 much closer than the CRVS implementation in FIG. 15, despite using less than half of the external storage capacitors.

Figure 18:
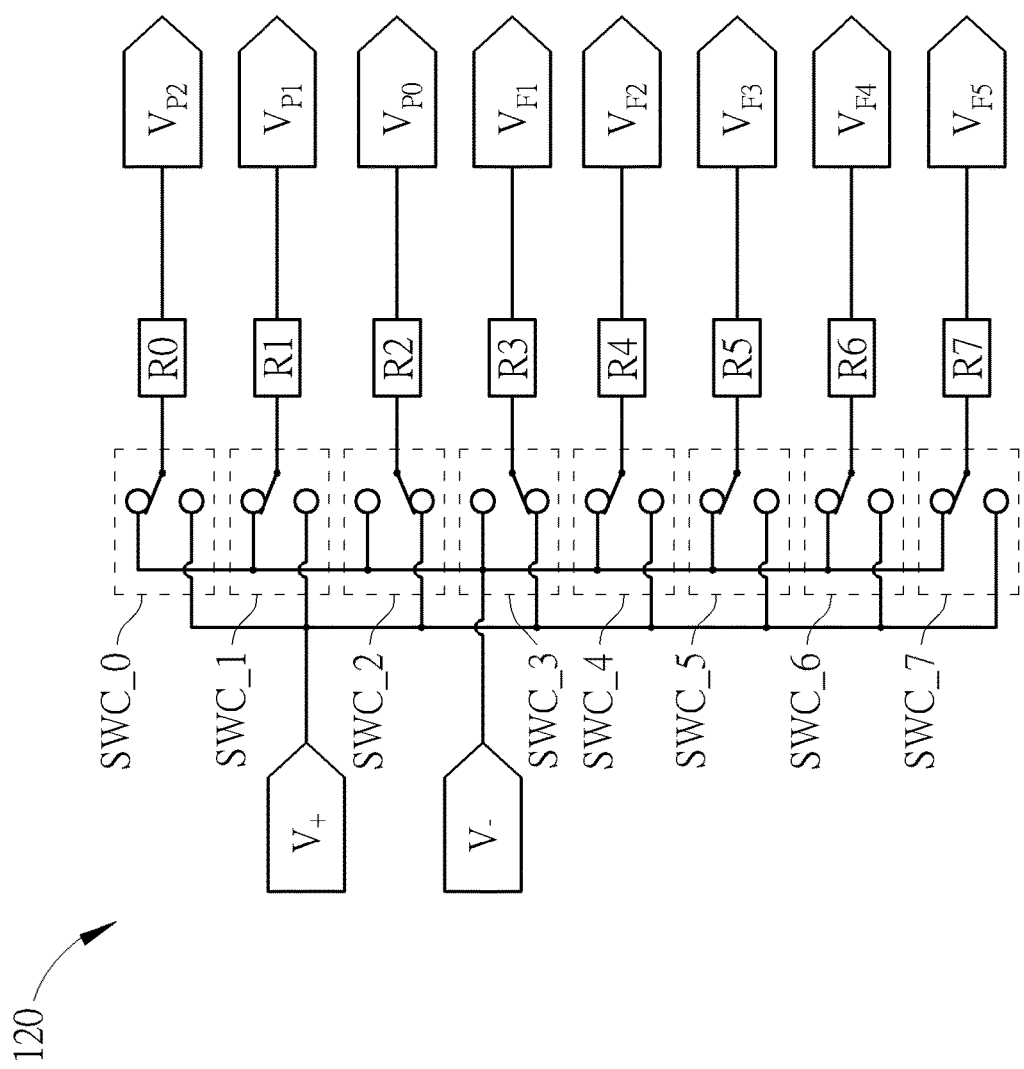
FIG. 18 is a schematic diagram of a driving-voltage generating circuit according to an embodiment of the present invention.

Refer to FIG. 18, a schematic diagram of the driving-voltage generating circuit 120 is shown. The driving-voltage generating circuit 120 may comprise switching circuits SWC_0-SWC_7 and resistors R0-R7. The switching circuits SWC_0-SWC_7 are symbolically illustrated. Details of the switching circuits SWC_0-SWC_7 may be referred to FIG. 14, where each switch circuit SWC_i may be realized by the switching circuit 60. The pentagon annotated as Vout in FIG. 14 represents each of the pentagons annotated as $V_{P0}$-$V_{P2}$ and $V_{F1}$-$V_{F5}$ in FIG. 18. The resistances of the resistors R0-R7 should be properly selected to yield consistent RC time constant for the loading capacitance corresponding to each specific node, corresponding to each of the air pulse generating groups P2, P1, P0, F1, F2, F3, F4, F5, so as to outputs the driving voltages $V_{P0}$-$V_{P2}$ and $V_{F1}$-$V_{F5}$.

In addition, an intrinsic asymmetry of the peak delta pressure exists when the air pulse generating element 14 produces the positive pulse and the negative pulse. Suppose that V denotes the air volume of the air chamber 140 and $\Delta V$ denotes the air volume moved by the membrane 102 during each pulse cycle 114. The intrinsic asymmetry is referred to the asymmetry between the peak delta-pressure during the positive pulse cycle and the negative cycle. Specifically, it represents that the peak delta-pressure during the positive pulse cycle, which is $(V+\Delta V)/(V-\Delta V)-1$, is not equal to the peak delta-pressure during the negative pulse cycle, which is $(V-\Delta V)/(V+\Delta V)-1$.

Figure 19:
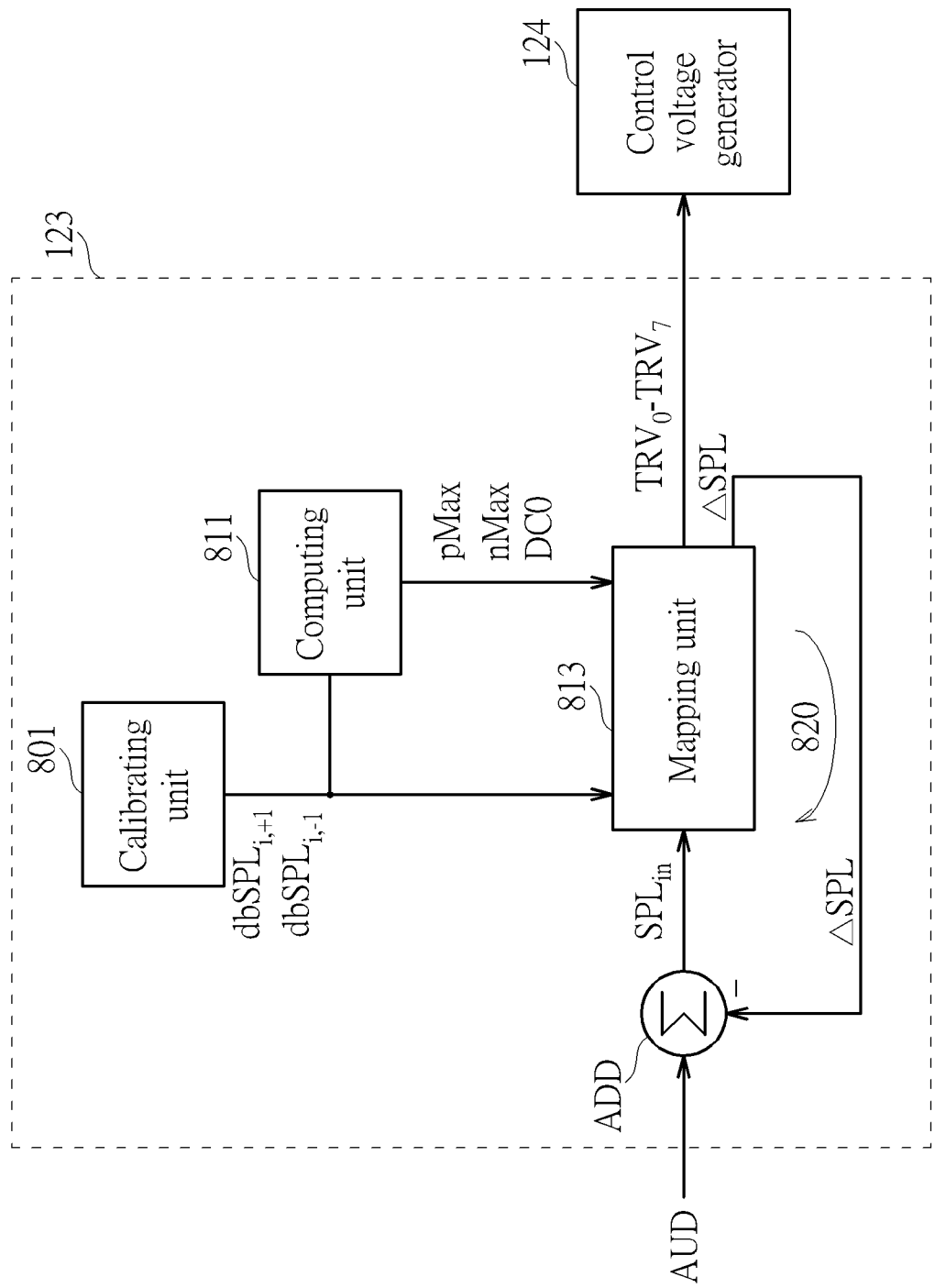
FIG. 19 is a schematic diagram of a base-3 conversion unit according to an embodiment of the present invention.

To combat against the intrinsic asymmetry and other error, a modified sigma-delta scheme is used in an embodiment of the control unit 12 of FIG. 1 to continuously updating a residual error therein. Refer to FIG. 19, a schematic diagram of the base-3 conversion unit 123 is illustrated. The base-3 conversion unit 123 may comprise an adder ADD, a calibrating unit 801 a computing unit 811 and a mapping unit 813.

The calibrating unit 801 is configured to calibrate a plurality of reference sound pressure levels $dbSPL_{i,+1}$ and $dbSPL_{i,-1}$. The reference sound pressure levels $dbSPL_{i,+1}$ is the measured SPL when all of the air pulse generating element(s) 14 within the i-th air pulse generating group produces the positive pulses. The reference sound pressure levels $dbSPL_{i,-1}$ is the measured SPL when all of the air pulse generating element(s) 14 within the i-th air pulse generating group produces the negative pulses. The i-th air pulse generating group is the air pulse generating group P(i-5) if i=7, 6, 5, or the air pulse generating group F(5-i) if i=4, 3, 2, 1, 0. In an embodiment, the calibrating unit 801 or the control unit 12 of FIG. 1 may stores the reference sound pressure levels $dbSPL_{i,+1}$ and $dbSPL_{i,-1}$ into a storage unit, e.g., a database.

The computing unit 811 may compute a positive maximum sound pressure level value pMax corresponding to the positive air pulses and a negative maximum sound pressure level value nMax corresponding to the negative air pulses. The computing unit 811 may compute a middle value DC0 according to the values pMax and nMax. Specifically, the computing unit 811 may compute the value pMax as $$pMax = \sum_{i=0}^{7} dbSPL_{i,+1},$$

and the computing unit 811 may compute the value nMax as $$nMax = \sum_{i=0}^{7} dbSPL_{i,+1}.$$

In addition, the computing unit 811 may compute the middle value DC0 as DC0=(pMax+nMax)/2. In an perspective, the value pMax may be regarded as the maximum SPL toward the back-to-front direction which the sound producing device 10 can achieve, and the value nMax may be regarded as the maximum SPL toward the front-to-back direction which the sound producing device 10 can achieve. A range between the value pMax and the value nMax may be regarded as a kind of dynamic range, and the middle value DC0 stands for the middle point of the dynamic range.

The reference sound pressure levels $dbSPL_{i,+1}$ and $dbSPL_{i,-1}$, the values pMax, nMax and the middle value DC0 are fed to the mapping unit 813. The mapping unit 813 may generate the trit values $TRV_7, \ldots, TRV_0$ and a residual error ΔSPL accordingly. Specifically, for a previous pulse cycle $114_{k-1}$, the mapping unit 813 may compute or estimate the residual error ΔSPL corresponding to the previous pulse cycle $114_{k-1}$, denoted as $\Delta SPL_{k-1}$. For a current pulse cycle $114_k$, the adder ADD combines the audio source sound pressure level AUD corresponding to the current pulse cycle $114_k$, denoted as $AUD_k$, with the residual error $\Delta SPL_{k-1}$, to generate a combined sound pressure level $SPL_{in}$ corresponding to the current pulse cycle $114_k$, denoted as $SPL_{in,k}$, where $SPL_{in,k} = AUD_k - \Delta SPL_{k-i}$. The mapping unit 813 computes the trit values $TRV_7, \ldots, TRV_0$ corresponding to the current pulse cycle $114_k$ and $\Delta SPL_k$ according to the current combined sound pressure level $SPL_{in,k}$, where $\Delta SPL_k$ is the residual error ΔSPL corresponding to the current pulse cycle $114_k$. The current residual error $\Delta SPL_k$ would be fedback to the adder ADD to calculate $SPL_{in,k+1} = AUD_{k+1} - \Delta SPL_k$ for the next pulse cycle $114_{k+1}$.

In an embodiment, the mapping unit 813 may execute a procedure 813', shown in the below, to compute the residual error ΔSPL and the trit values $TRV_7, \ldots, TRV_0$. Notably, the loop structure 820, shown in FIG. 19 feeding back the residual error ΔSPL, is analogous to a sigma-delta DAC (digital-to-analog converter), which is able to achieve noise reshaping and distortion (caused by nonlinearity) compensation.

| Procedure 813' |
|---|
| // Initialization<br>ΔSPL = $SPL_{in}$ - DC0;<br>pSPL = pMax;<br>nSPL = npMax;<br>// Loop From MST to second LST<br>For (i=7, i>0, i--) {<br>  pSPL = pSPL − $dbSPL_{i,+1}$;<br>  nSPL = nSPL − $dbSPL_{i,+1}$;<br>  if (nSPL ≤ ΔSPL ≤ pSPL) {<br>    $TRV_i$ =0;<br>  }else if (ΔSPL > 0) {<br>    $TRV_i$ =+1;<br>    ΔSPL =ΔSPL − $dbSPL_{i,+1}$;<br>  } else{ //ΔSPL<0<br>    $TRV_i$ =−1;<br>    ΔSPL =ΔSPL − $dbSPL_{i,-1}$;<br>  }<br>}<br>// Execution of LST (i.e., i=0)<br>if ($dbSPL_{i,-1}$/2 ≤ ΔSPL ≤ $dbSPL_{i,+1}$/2) {<br>  $TRV_i$ =0;<br>}else if (ΔSPL > 0) {<br>  $TRV_i$ =+1;<br>  ΔSPL =ΔSPL − $dbSPL_{0,+1}$;<br>} else{ //ΔSPL<0<br>  $TRV_i$ =−1;<br>  ΔSPL =ΔSPL − $dbSPL_{0,-1}$;<br>} |

The functional blocks of the base-3 conversion unit 123 shown in FIG. 19 are for illustrative purpose. Functions of the base-3 conversion unit 123, including the procedure 813', may be implemented by hardware, software, or combination of both, depending on practical design circumstances.

Note that, the control voltage generator 124 generates the driving voltages $V_{MBN}$ which are applied to the air pulse generating groups P0-P2 and F1-F5, or equivalently, $V_{P0}$-$V_{P2}$ and $V_{F1}$-$V_{F5}$ according to the trit values $TRV_7, \ldots, TRV_0$. That is, the driving voltage $V_{MBN}$ is generated according to middle value DC0 and the values pMax, nMax, so as to fully utilize the dynamic range of the sound producing device 10.

In an alternate embodiment of the current invention, the pulse rate of the plurality of air pulses can be adjusted dynamically according to content of the input audio signal to be reproduced. For example, in a case where during a first period the input audio signal contains a human male announcer voice and during a second period the input audio signal contains a trumpet music, a first maximum audio frequency of the first period of input audio signal is significantly lower than a second maximum audio frequency of the second period of input audio signal. The pulse rate of the sound producing device 10 can be adjusted lower during the first period of input audio signal and adjust higher during the second period of input audio signal.

Specifically, the sound producing device 10 may be coupled to a pulse rate determining unit, where the pulse rate generating unit may comprise an input audio analyzer. The input audio analyzer may analyze the input audio signal over certain period of time to determine a maximum audio frequency of the input audio signal, and the pulse rate determining unit may determine the pulse rate for the sound producing device 10. Thereby, the pulse rate of the sound producing device 10 may be adjustable according to different scenarios or different applications, which may lower the power consumption since the power consumption is positively correlated to the pulse rate.

Referring back to FIG. 10, the voltage curves 711-717 and 711'-717' have the same min-max values (either from V0 to V5 or from V5' to V0') but different voltage profiles. In an embodiment, some or all the voltage curves 711-717 and 711'-717' may be applied as the driving voltages $V_{P0}$-$V_{P2}$ and $V_{F1}$-$V_{F5}$ in one pulse cycle 114. That is, within a certain pulse cycle 114, the driving voltages $V_{P0}$-$V_{P2}$ and $V_{F1}$-$V_{F5}$ may have the same min-max values but different voltage profiles. In an embodiment, some or all the voltage curves 711-717 and 711'-717' may be applied to the driving voltage $V_{MBN}$, which may represent one of the driving voltages $V_{P0}$-$V_{P2}$ and $V_{F1}$-$V_{F5}$. That is, among different pulse cycles 114, the driving voltage $V_{MBN}$ may have the same min-max values but different voltage profiles, with respect to time.

In addition, the sound producing device 10 may also perform active thermal management or active cooling functions. Specifically, for sound producing devices 10 disposed within an electronic device such as a smartphone, a tablet or a laptop computer, the sound producing device 10 may continuously generate a series of positive air pulses in the back-to-front direction (i.e., in a push-out direction) or continuously generate a series of negative air pulses in the front-to-back direction (i.e., in a pull-in direction). In either of these two cases, the sound producing device 10 has further performed the function of a fan, generating a continuous push-out air flow or a pull-in air flow, in addition to the function of speaker, producing audible sound.

Figure 20:
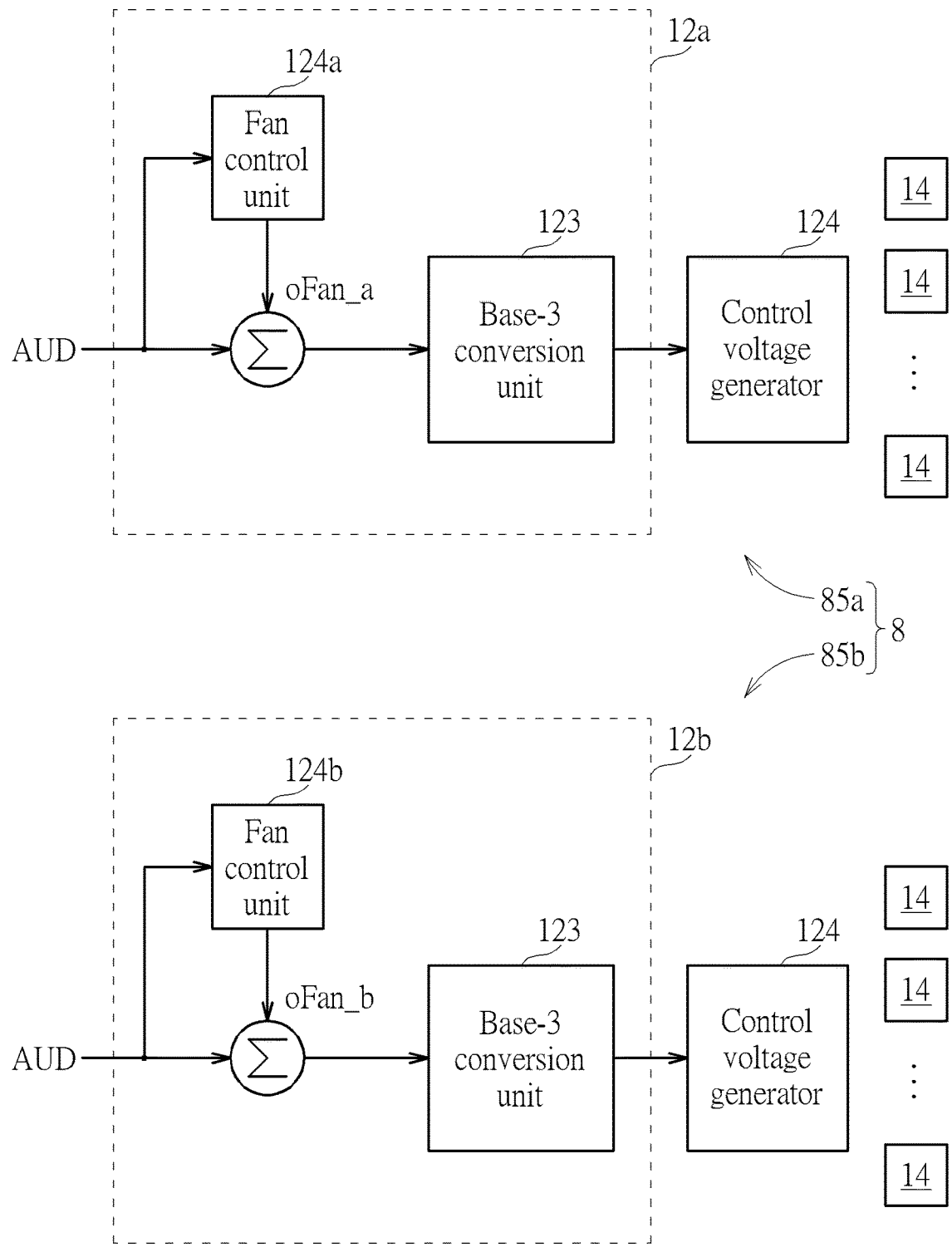
FIG. 20 is a schematic diagram of two sound producing devices according to an embodiment of the present invention.

Refer to FIG. 20, a schematic diagram of a sound producing device 85a and a sound producing device 85b is illustrated. The sound producing devices 85a and 85b form a stereo speaker system. The sound producing device 85a/85b is similar to the sound producing device 10, and thus, same components are denoted by the same denotations.

Different from the sound producing device 10, the sound producing devices 85a comprises a control unit 12a. In addition to the function blocks of control unit 12, the control unit 12a further comprises a fan control unit 124a. The fan control unit 124a is configured to generate a fan control value oFan_a. The fan control value oFan_a may be a DC (direct current) value, nearly a DC value or a low frequency value, where the frequency of which is sufficiently low such that the sound produced according to the fan control value oFan_a would not be perceived by human ears. The control unit 12a combines/adds the fan control value oFan_a with the audio source sound pressure level AUD, thereby the sound producing devices 85a may generate the push-out air flow or the pull-in air flow, meaning that the sound producing devices 85a may continuously generate the series of positive air pulses in the push-out direction or negative air pulses in the pull-in direction. Such continuous air flow, either in push-out or in pull-in direction, can be guided through/toward locations where high heat are being generated such that the heat accumulation in the electronic device, in which the sound producing device 85a is disposed, is reduced.

In addition, a sign/polarity of the fan control value oFan_a may be inverted periodically, to reduce accumulation of debris and dust within the electronic device the sound producing device 85a is disposed in. It means that the fan control value oFan_a may be positive during a first period of time, and is inverted as negative during a second period of time. It also means that the air flow direction may be reversed (i.e., from the pull-in direction to the push-out direction, or vice versa) periodically.

In addition, the fan control value oFan_a may be generated according to the audio source sound pressure level AUD. When the audio source sound pressure level AUD is high, occupying the dynamic range of the sound producing device 10, the fan control value oFan_a may be low, and vice versa.

Feature or operation principle of the sound producing device 85b is the same as which of the sound producing device 85a, and thus not narrated herein for brevity.

Figure 21:
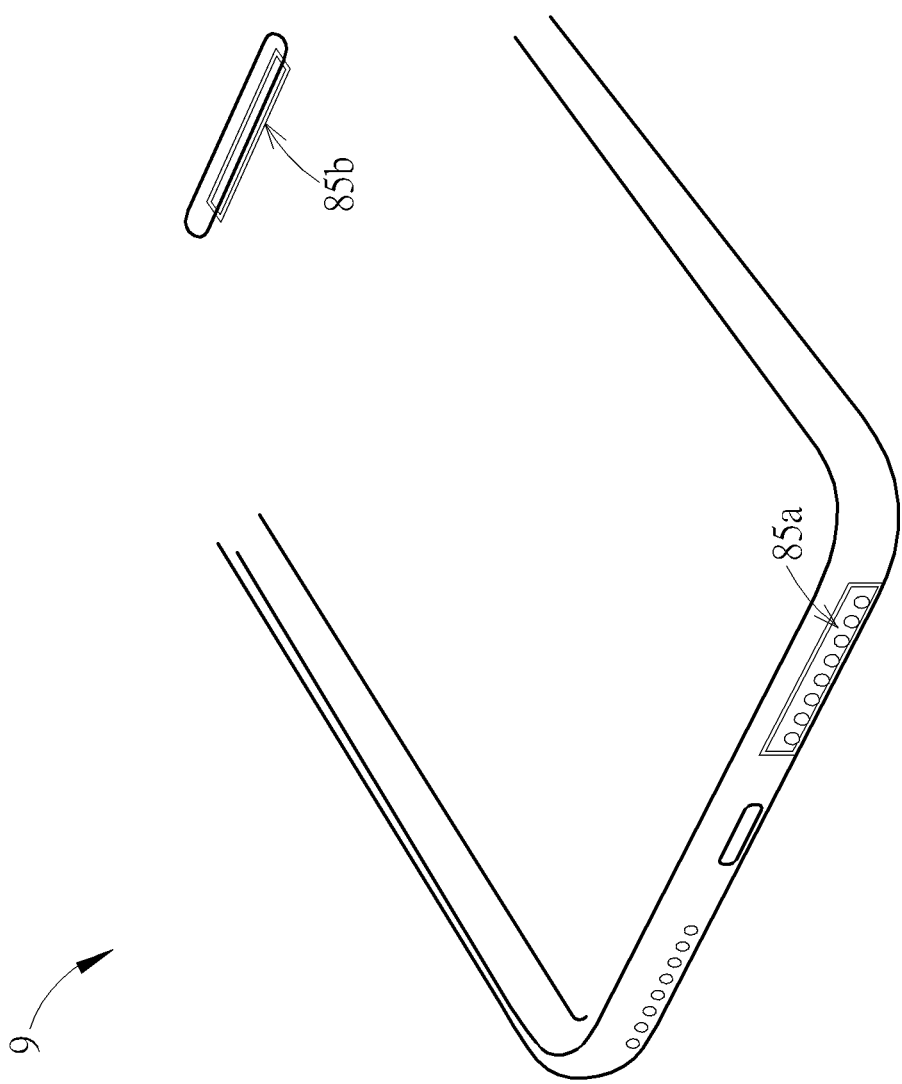
FIG. 21 is a schematic diagram of an electronic device according to an embodiment of the present invention.

Refer to FIG. 21, a schematic diagram of an electronic device 9 is illustrated. Within the electronic device 9, the sound producing devices 85a and 85b are disposed. Notably, the fan control value oFan_a and the fan control value oFan_b may have opposite sign. For example, the fan control value oFan_a may be positive and the fan control value oFan_b may be negative. In this case, the sound producing device 85a pushes the air out of the internal of the electronic device 9, and the sound producing device 85b pulls the air into the internal of the electronic device 9, such that the air would flow from the location of the sound producing device 85b to the location of the sound producing device 85a. Thereby, performance of heat dissipation within the electronic device 9 is enhanced.

Figure 22:
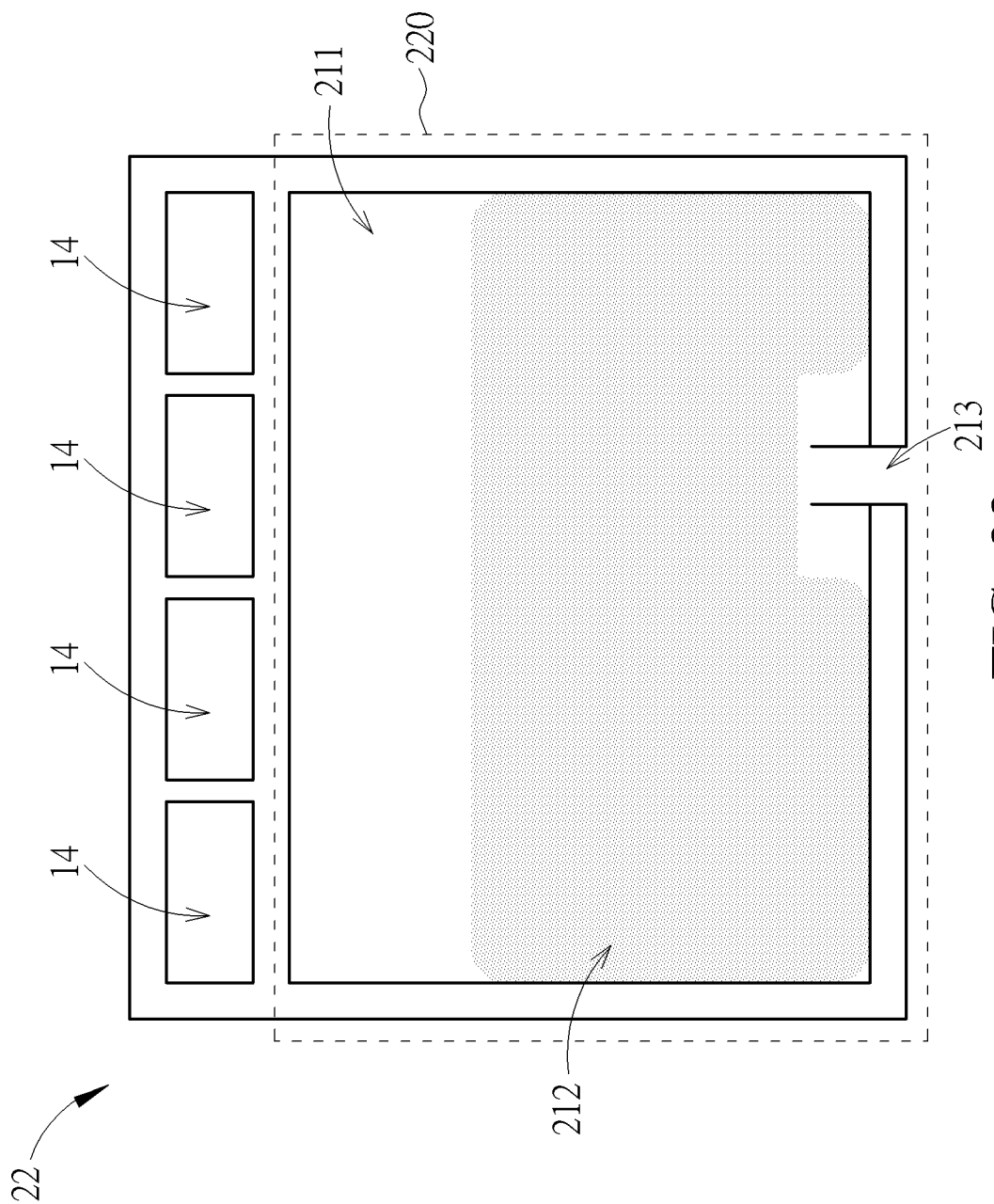
FIG. 22 is a schematic diagram of a speaker according to an embodiment of the present invention.

The sound producing device 10 may be disposed in a standalone speaker. Refer to FIG. 22, a cross section view of a speaker 22 is illustrated. The speaker 22 comprises the sound producing device 10 and a back enclosure 220. For simplicity, only the air pulse generating elements 14 is shown in FIG. 22, and the control unit 12 is omitted. The back enclosure 220 is configured to avoid the air pulses emitted toward the front being cancelled by the air pulses emitted toward the back. The back enclosure 220 may contain an internal volume 211, comprise an absorption object 212, and form an opening 213. The absorption object 212 may be made of material such as sound absorbing foam. The absorption object 212 is configured to dissipate the energy of the air pulse generated by the air pulse generating elements 14 in the front, which is to damp down the sound produced by the air pulse generating elements 14. After damping by the absorption object 212, what is remained is the volume of air moved in a series of UPA which may be exit out of the back enclosure 220 through the opening 213. Being a passage for the remaining air is one function of the opening 213.

Another function of the opening 213 is to perform low pass filtering. Specifically, the opening 213 may be shaped as a short pipe or a tunnel, as shown in FIG. 22, to form a port for the back enclosure 220. The resonant frequency (or tuning frequency) of the port formed by the opening 213 may be tuned by dimensions, such as diameter or length, of the opening 213. Frequency component higher than the tuning frequency of the opening 213 will be blocked from passing through the opening 213 and further dissipated by the absorption object 212 within the back enclosure 220. Frequency components below the tuning frequency will flow through the opening 213.

Note that, compared to the conventional speaker, the tuning frequency of the back enclosure 220 of speaker 22 according to the present invention is decoupled from the low frequency response of the speaker 22 and may be about 10 times higher than what would have been the tuning frequency of the conventional speaker. In the conventional speaker, the tuning frequency of the back enclosure is stuck to the low audio frequency toward which the conventional speaker tends to extend. For example, the tuning frequency of the conventional back enclosure may be in a range of 20-60 Hz, which requires a large enclosure volume and a large port diameter in order to maintain high fidelity at low frequency. On the other hand, the tuning frequency of the back enclosure 220 is determined such that the back radiating sound energy is insufficient to destruct the front radiating sound energy. In an embodiment, the tuning frequency of the back enclosure 220 may be within a range of 400-500 Hz, at which the back radiating sound energy is about 25-30 times less than the front radiating sound energy. The tuning frequency of the back enclosure 220 can therefore be about 10 times higher than the tuning frequency of the conventional back enclosure, and thus, the enclosure volume and the port diameter for the speaker 22 is significantly reduced.

In an embodiment of FIG. 2, a dimension of the membrane 102 may be 0.9 mm$^2$, a mean membrane displacement between the positions 107 and 108 may be 6 μm, and the pulse/air pulse generating rate may be 64 KHz. It is known that a chamber port tuning $$f_{CP} \cong \frac{f_{pulserate}}{K}$$

and an enclosure volume $$V_{EN} \cong \frac{K \cdot V_P}{2 \cdot L},$$

where L is maximum pressure delta and $V_P$ is air volume for each air pulse, by choosing K=150 and L=1% for the sound producing device 10, it is obtained that $V_P \cong 0.000068$ cc, $V_{EN} \cong 0.5$ cc with $f_{CP} \cong 427$ Hz.

As can be seen from the above, the enclosure volume $V_{EN}$ of the speaker 22 is drastically reduced compared to the enclosure volume of conventional speakers. Therefore, the speaker 22 is suitable for embedding inside a compact electronic device such as a cellphone, by overcoming not only the challenge of the sound fidelity but also the challenge of enclosure volume.

Rather than disposing the sound producing device 10 within the standalone speaker, the sound producing device 10 may also be disposed on a surface/side of an electronic device, similar to FIG. 21. No back enclosure is needed in this circumstance. For example, when the sound producing device 10 is disposed by a surface/side of an electronic device, a casing/housing of the electronic device naturally forms the back enclosure, analogous to the back enclosure 220. Since the internal components is complicated disposed within the electronic device, the back way air pulses may viewed as being reflected toward random directions. After the back way air pulses are reflected by the complicated disposed components inside the electronic device, destructive interference among the back way air pulses occurs, and the energy of the back way air pulse is dissipated. It therefore can be seen that the internal components within the electronic device play the same role of the absorption object 212, which is to dissipate the back way pulse energy. The remaining air after the destructive interference caused by the internal components may exit/flow through holes or gaps on the casing/housing, which is analogous to the opening 213 in FIG. 22. Thereby, the sound producing device 10 may be disposed in the electronic device without an apparent back enclosure while still produce performance as if such an enclosure were present.

Figure 23:
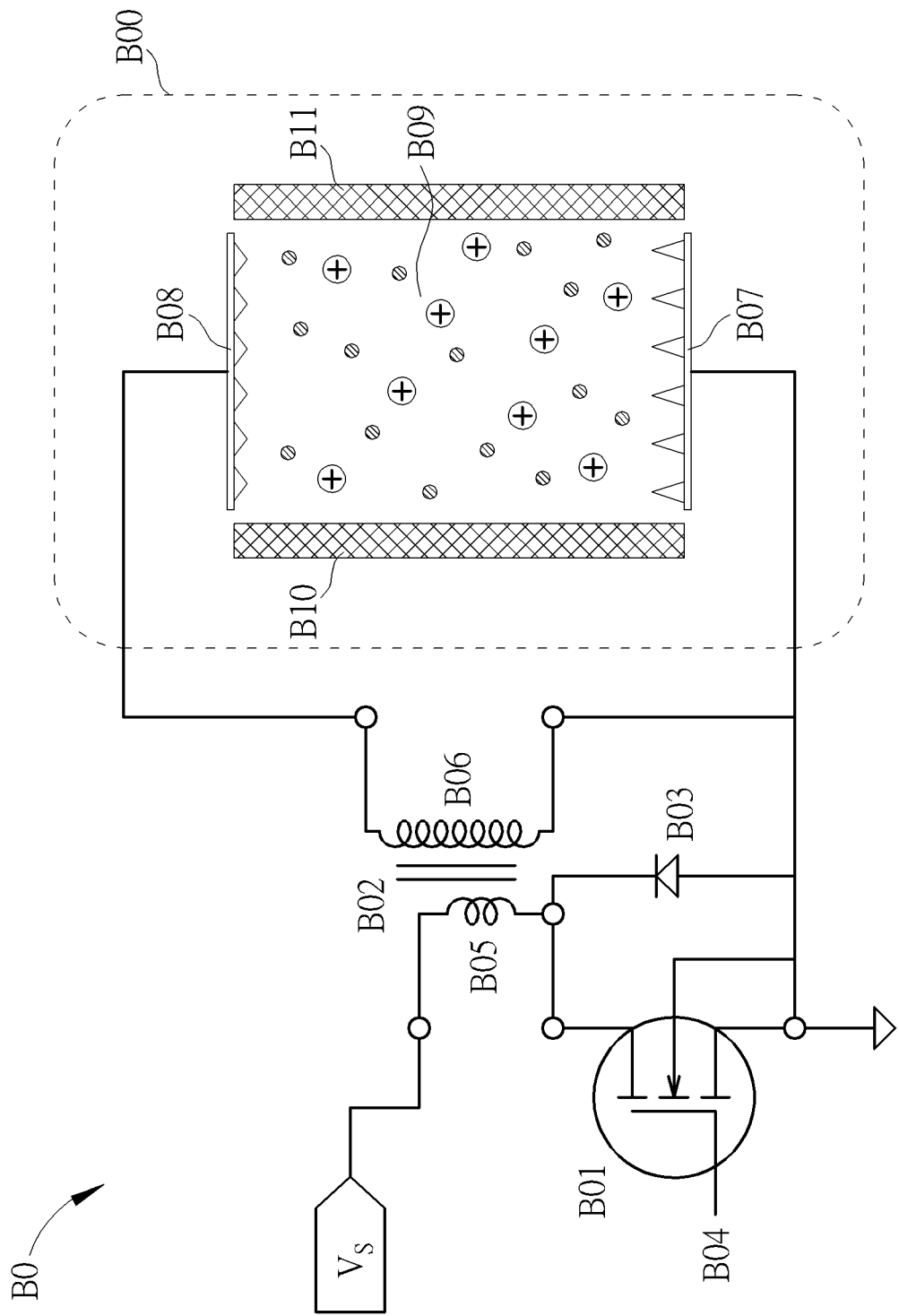
FIG. 23 is a schematic diagram of an air pulse generating device according to an embodiment of the present invention.

Refer to FIG. 23, a circuit schematic diagram of an air pulse generating element B0 is illustrated. The air pulse generating element B0 utilizes E-field-accelerated ionized air to generate the UPA. The air pulse generating element B0 comprises: a fly-back transformer B02 for generating high voltage pulses; an FET transistor B01 and diode B03 to drive the transformer B02; and an actuator B00. The actuator B00 comprises a spindt-type microstrip cathode B07 and a anode B08 to ionize air within a chamber B09; and perforated plates B10 and B11 to create E-field for accelerating ionized air and generate air pulses. In other words, the actuator BOO of the air pulse generating element B0 may produce the plurality of air pulses through ionized air by applying an appropriate electric field between the perforated plates B10 and B11.

Figure 24:
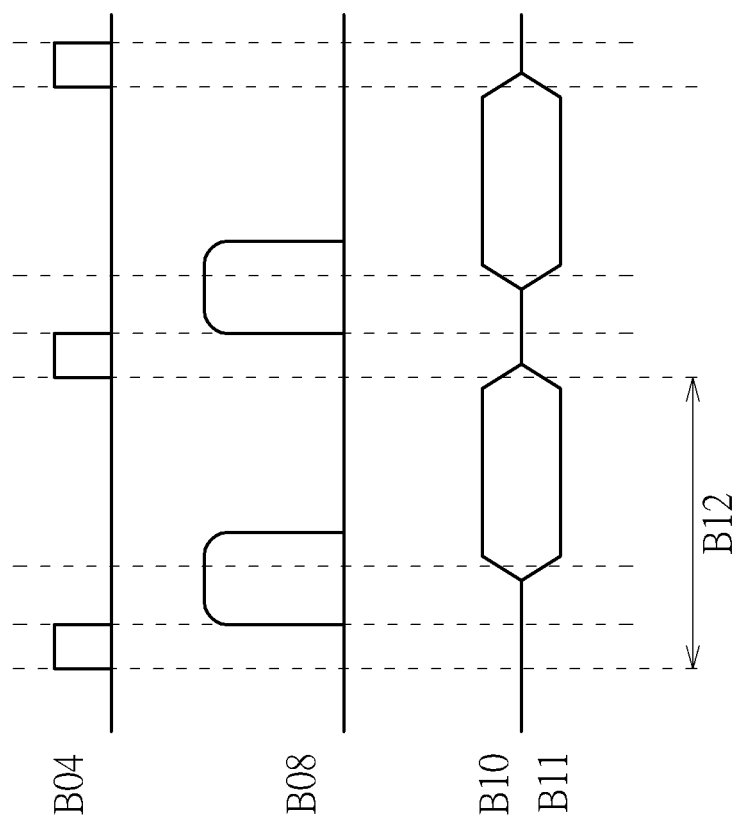
FIG. 24 is a timing diagram of the air pulse generating device of FIG. 23.

Refer to FIG. 24, a timing diagram of the air pulse generating element B0 is illustrated. When the fly-back transformer B02 is suitably energized through switching action of the transistor B01 and the diode B03, a high-voltage (HV) pulse will be generated. The HV pulse causes the cathode B07 to emit electrons which is subsequently accelerated toward the anode B08, causing gaseous ions to be produced within the chamber B09. After the air within the chamber B09 is sufficiently ionized, voltage profiles such as FIG. 10 may be applied across the plates B10, B11, so as to generate E-field orthogonal to the vector pointing from the cathode B07 to the anode B08. The said E-filed between B10 and B11 causes gas ions to accelerate, either in a B10-to-B11 direction or in a B11-to-B10 direction, and to subsequently produce air flow by colliding with other gas molecules. Such air flow will emerge through the holes on plate B10 and B11 and form air pulses which can be observed outside of the air pulse generating element B0. By controlling the voltage applied across B10 and B11, the air flow patterns may be similar to those shown in FIG. 5 through FIG. 7. The device B00 may be viewed as an actuator. Thereby, the actuator B00 within the air pulse generating element B0 is able to produce the plurality of air pulses through accelerating ionized air with electric field.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sound producing device, comprising:
   an air pulse generating element, comprising:
      an air chamber; and
      an actuator; and
   a control unit, configured to generate a driving voltage applied to the actuator of the air pulse generating element, such that the air pulse generating element generates a plurality of air pulses in response to the driving voltage;
   wherein the plurality of air pulses are at a pulse rate, and the pulse rate of the plurality of air pulses is higher than a maximum audible frequency;
   wherein the plurality of air pulses produces a non-zero offset in terms of sound pressure level, and the non-zero offset is a deviation from a zero sound pressure level.

2. The sound producing device of claim 1, wherein an air mass velocity, produced by an air pulse among the plurality of plurality of air pulses, is initiated from an initial value, increases and achieves a peak value, and decreases down to a final value within a pulse cycle of the air pulse.

3. The sound producing device of claim 1, wherein an air pulse, among the plurality of air pulses, within a pulse cycle is a positive pulse, a negative pulse or a null pulse, and air mass velocities corresponding to the positive pulse and the negative pulse are in opposite directions.

4. The sound producing device of claim 1, wherein for a specific sound pressure level, volume of air moved by the plurality of air pulses is proportional to a reciprocal of an audio frequency.

5. The sound producing device of claim 1, wherein the sound producing device receives an input audio signal, and an amplitude and a polarity of each air pulse generated by the sound producing device are related to a amplitude and a polarity of a time-sample of the input audio signal.

6. The sound producing device of claim 1, wherein the sound producing device comprises a plurality of air pulse generating elements, the control unit generates a plurality of driving voltages to the plurality of air pulse generating elements, such that the plurality of air pulse generating elements produces a plurality of sound pressure levels.

7. The sound producing device of claim 6, wherein the plurality of air pulse generating elements is grouped into a plurality of air pulse generating groups, each air pulse generating group comprises one or more air pulse generating element, and the control unit generates the plurality of driving voltages corresponding to the plurality of air pulse generating groups.

8. The sound producing device of claim 1, wherein the actuator produces the plurality of air pulses through piezoelectric force.

9. The sound producing device of claim 1, wherein the pulse rate of the plurality of air pulses is at least twice higher than a maximum frequency of an input audio signal to be reproduced.

10. The sound producing device of claim 1, wherein the pulse rate of the plurality of air pulses is at least twice higher than a maximum audible frequency.

11. The sound producing device of claim 1, wherein the pulse rate of the plurality of air pulses is adjustable according to content of an input audio signal to be reproduced.

12. The sound producing device of claim 1, wherein the air pulse element further comprises:
   a membrane, wherein the sound producing device forms an air chamber and the membrane partitions the air chamber into a plurality of sub-chambers; and a plurality of valves, controlled by the control unit to be opened and closed, so as to control a direction of an air flow corresponding to an air pulse within one sub-chamber of the plurality of sub-chamber.

13. The sound producing device of claim 12, further comprising:
an actuating means disposed on the membrane, such that the membrane performs an up-and-down movement caused by the actuating means.

14. The sound producing device of claim 13, wherein the direction of the air mass velocity within a pulse cycle is in a front-to-back direction or a back-to-front direction regardless an initial position of the membrane, and the control unit generates a plurality of valve control signals to the plurality of valves to perform an open-and-close movement.

15. The sound producing device of claim 14, wherein the up-and-down movement performed by the actuating means and the open-and-close movement performed by the plurality of valves are mutually synchronized.

16. The sound producing device of claim 1, wherein the control unit is further configured to perform the following steps:
obtaining a residual error corresponding to a first pulse cycle;
combining an audio source sound pressure level of a second pulse cycle with the estimated residual error corresponding to the first pulse cycle to generate a combined sound pressure level, wherein the first pulse cycle is prior to the second pulse cycle; and
generating the residual error and the driving voltage according to the combined sound pressure level.

17. The sound producing device of claim 16, wherein the control unit is further configured to perform the following steps:
calibrating reference sound pressure levels produced by the air pulse generating element;
storing the calibrated reference sound pressure levels in to a storage unit; and
generating the residual error and the driving voltage according to the combined sound pressure level and the calibrated reference sound pressure levels.

18. The sound producing device of claim 17, wherein the control unit is further configured to perform the following steps:
calibrating sound pressure level produced by the air pulse generating element, so as to generate a first maximum sound pressure level value corresponding a positive air pulse and a second maximum sound pressure level value corresponding a negative air pulse;
calculating a middle value according to the first maximum sound pressure level and the second maximum sound pressure level; and
generating the driving voltage according to the middle value, so as to fully utilize a dynamic range of the sound producing device.

19. A speaker, comprising:
the sound producing device of claim 1;
a back enclosure, containing an internal volume to buffer the plurality of air pulses, wherein the back enclosure comprises:
an absorption object configured to dissipate pulsing energy of the plurality of air pulses.

20. The speaker of claim 19, wherein an air passage is formed on the back enclosure to allow remaining air flow exiting out of the back chamber.

21. The speaker of claim 19, wherein the speaker is disposed within an electronic device, the back chamber is formed by a casing of the electronic device and an unoccupied volume within the electronic device forms the internal volume, internal components within the electronic device and space in between forms the absorption object.

22. The sound producing device of claim 1, wherein the plurality of air pulses are in terms of sound pressure level, and the sound pressure level within each pulse cycle is related to an amplitude and a polarity of an input audio signal.

23. The sound producing device of claim 1, wherein the plurality of air pulses are in terms of an aggregated air volume movement generated by the sound producing device, and the aggregated air volume movement within each pulse cycle is related to an amplitude and a polarity of an input audio signal.

24. A speaker system, comprising:
a first sound producing device, wherein the first sound producing device is the sound producing device of claim 1, and the control unit within the first sound producing device comprises a first fan control unit, the first fan control unit is configured to generate a first fan control value;
wherein the air pulse generating element of the first sound producing device produces a first air flow according to the first fan control value.

25. The speaker system of claim 24, wherein a sign of the first fan control value is inverted periodically to reduce accumulation of debris and dust.

26. The sound producing device of claim 1, wherein the air pulse generating element comprises:
a front faceplate disposed at a front side of the air pulse generating element;
a back faceplate disposed at a back side of the air pulse generating element, opposite to the front faceplate
a first valve, controlled by a first valve-controlling signal, controlling an airflow through the front faceplate; and
a second valve, controlled by a second valve-controlling signal, controlling the airflow through the back faceplate;
wherein a first sub-chamber is formed between the first valve and the second valve.

27. The sound producing device of claim 26, wherein the air pulse generating element comprises:
a third valve, controlled by the third valve-controlling signal, controlling the airflow through the back faceplate; and
a fourth valve, controlled by the fourth valve-controlling signal, controlling the airflow through the front faceplate
wherein a second sub-chamber is formed between the third valve and the fourth valve.

28. The sound producing device of claim 27, wherein
the first valve-controlling signal equals the third valve-controlling signal;
and the second valve-controlling signal equals the fourth valve-controlling signal.

29. The sound producing device of claim 1, wherein the plurality of air pulses generated by the air pulse generating element is aperiodic over a plurality of pulse cycles.

30. A sound producing device, comprising:
an air pulse generating element, comprising:
an air chamber; and
an actuator; and
a control unit, configured to generate a driving voltage applied to the actuator of the air pulse generating element, such that the air pulse generating element generates a plurality of air pulses in response to the driving voltage;

wherein the plurality of air pulses are at a pulse rate, and the pulse rate of the plurality of air pulses is higher than a maximum audible frequency;

wherein the plurality of air pulses generated by the air pulse generating element is aperiodic over a plurality of pulse cycles.

\* \* \* \* \*